United States Patent
Hartmann et al.

(10) Patent No.: US 11,804,568 B2
(45) Date of Patent: Oct. 31, 2023

(54) OPTOELECTRONIC COMPONENT, OPTOELECTRONIC COMPONENT GROUP IN BUFFER LAYER OPENING AND PRODUCTION METHOD FOR SAME

(71) Applicant: Osram OLED GmbH, Regensburg (DE)

(72) Inventors: Rainer Hartmann, Regensburg (DE); Clemens Vierheilig, Tegernheim (DE); Tobias Meyer, Kelheim (DE); Andreas Rueckerl, Konzell (DE); Tilman Schimpke, Regensburg (DE); Michael Binder, Barbing (DE)

(73) Assignee: Osram OLED GmbH, Regensburg (DE)

( * ) Notice: Subject to any disclaimer, the term of this patent is extended or adjusted under 35 U.S.C. 154(b) by 302 days.

(21) Appl. No.: 16/980,859

(22) PCT Filed: Apr. 26, 2019

(86) PCT No.: PCT/EP2019/060759
§ 371 (c)(1),
(2) Date: Sep. 15, 2020

(87) PCT Pub. No.: WO2019/211193
PCT Pub. Date: Nov. 7, 2019

(65) Prior Publication Data
US 2021/0043796 A1    Feb. 11, 2021

(30) Foreign Application Priority Data
Apr. 30, 2018  (DE) ............... 10 2018 110 344.1

(51) Int. Cl.
H01L 27/15        (2006.01)
H01L 29/26        (2006.01)
(Continued)

(52) U.S. Cl.
CPC ...... H01L 33/0093 (2020.05); H01L 25/0753 (2013.01); H01L 33/0095 (2013.01); H01L 33/12 (2013.01); H01L 33/62 (2013.01)

(58) Field of Classification Search
CPC . H01L 25/0753; H01L 33/0095; H01L 33/12; H01L 33/62; H01L 33/54; H01L 2933/005; H01L 33/005
See application file for complete search history.

(56) References Cited

U.S. PATENT DOCUMENTS

| | | |
|---|---|---|
| 2010/0186883 A1 | 7/2010 | Tomoda |
| 2011/0079805 A1* | 4/2011 | Yu .................... H01L 33/382 257/E33.056 |
| 2011/0297913 A1 | 12/2011 | Kim et al. |
| 2017/0236807 A1 | 8/2017 | Hwang et al. |

(Continued)

FOREIGN PATENT DOCUMENTS

| | | |
|---|---|---|
| DE | 102010012711 A1 | 9/2011 |
| WO | 2016122725 A1 | 8/2016 |

OTHER PUBLICATIONS

International Search Report issued for corresponding PCT Application No. PCT/EP2019/060759, dated Jul. 5, 2019, 4 pages (for informational purpose only).

German Search Report issued for corresponding DE Application No. 10 2018 110 344.1, dated Nov. 13, 2018, 8 pages (for informational purpose only).

(Continued)

*Primary Examiner* — Ismail A Muse
(74) *Attorney, Agent, or Firm* — VIERING, JENTSCHURA & PARTNER MBB

(57) ABSTRACT

Optoelectronic components, groups of optoelectronic components, and methods for producing a component or a plurality of optoelectronic components are provided. The method may include providing a growth substrate having a buffer layer arranged thereon. The buffer layer may be structured in such a way that it has a plurality of the openings which are spaced apart from one another in lateral directions. A plurality of semiconductor bodies may be formed in the openings, wherein in the areas of the openings, the buffer (Continued)

layer has subregions which are arranged in a vertical direction between the growth substrate and the semiconductor bodies. The growth substrate may be detached from the semiconductor bodies. The buffer layer may be removed at least in the areas of the subregions.

16 Claims, 20 Drawing Sheets

(51) Int. Cl.
*H01L 31/12* (2006.01)
*H01L 33/00* (2010.01)
*H01L 25/075* (2006.01)
*H01L 33/12* (2010.01)
*H01L 33/62* (2010.01)

(56) References Cited

U.S. PATENT DOCUMENTS

| | | | |
|---|---|---|---|
| 2019/0081025 A1* | 3/2019 | Chang | H01L 33/025 |
| 2020/0357844 A1* | 11/2020 | Tan | H01L 24/80 |
| 2021/0159269 A1* | 5/2021 | Kim | H01L 33/025 |
| 2021/0202450 A1* | 7/2021 | Min | H01L 25/0753 |
| 2021/0313490 A1* | 10/2021 | Kim | H01L 33/40 |
| 2022/0140186 A1* | 5/2022 | Min | H01L 33/62 257/79 |
| 2022/0260863 A1* | 8/2022 | Yu | G02B 6/12 |

OTHER PUBLICATIONS

Man et al..; "A Study of pretreatment process on selective area growth of GaN using SiN masks"; 2014; 1 page Japanese + 1 page English Translation; The 75th JSAP Autumn Meeting, Sapporo, Japan, 19p-PB6-4.

* cited by examiner

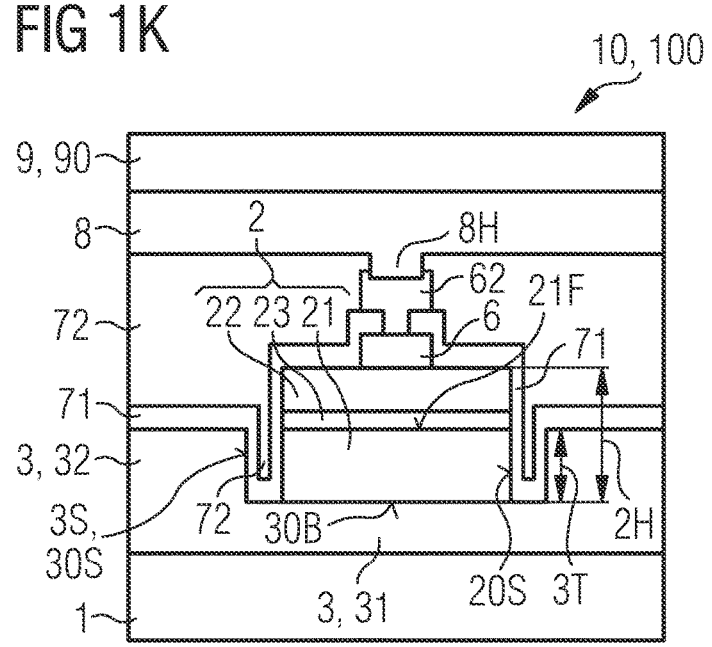
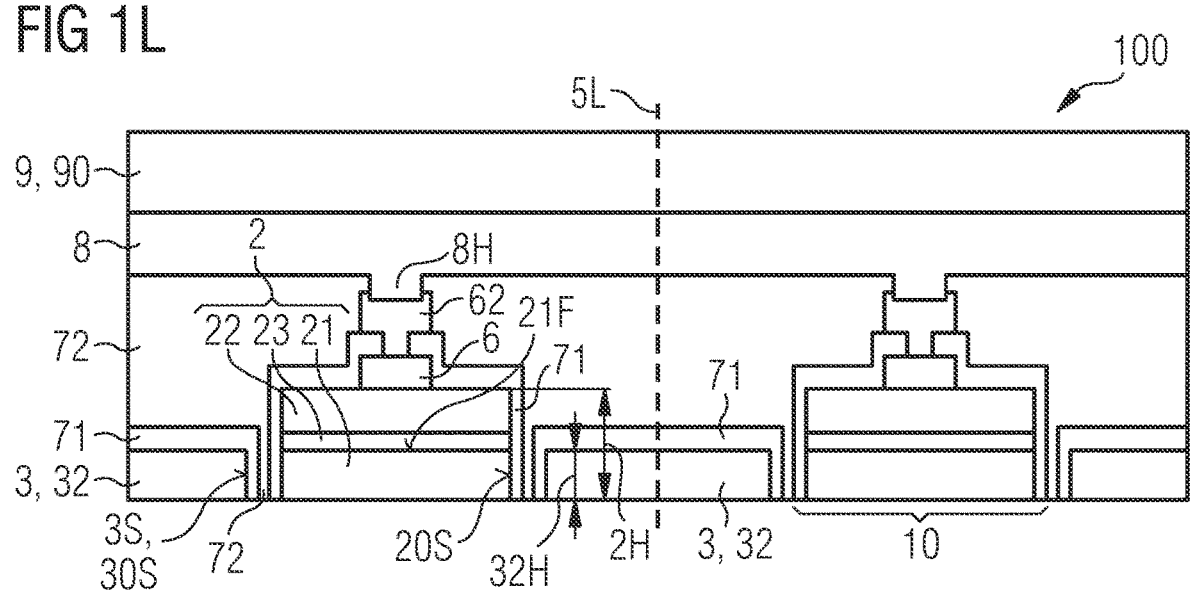

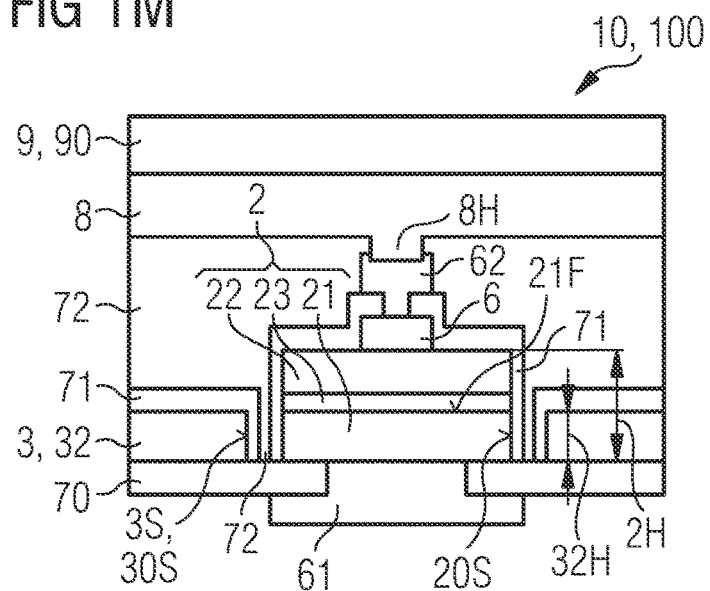
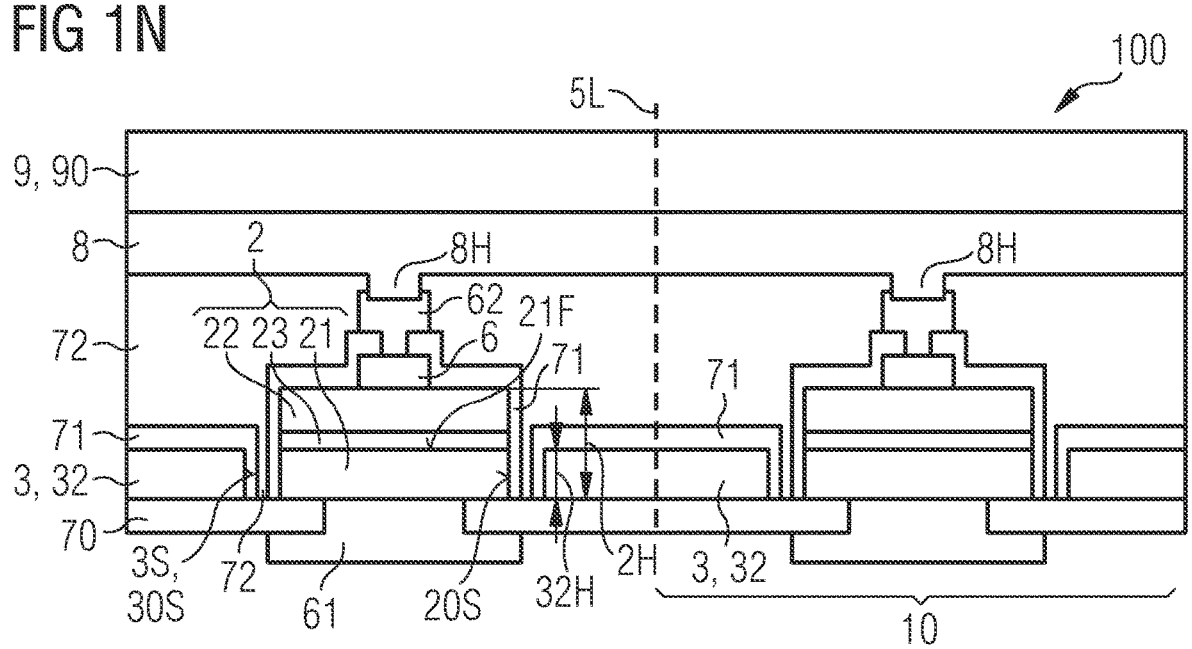

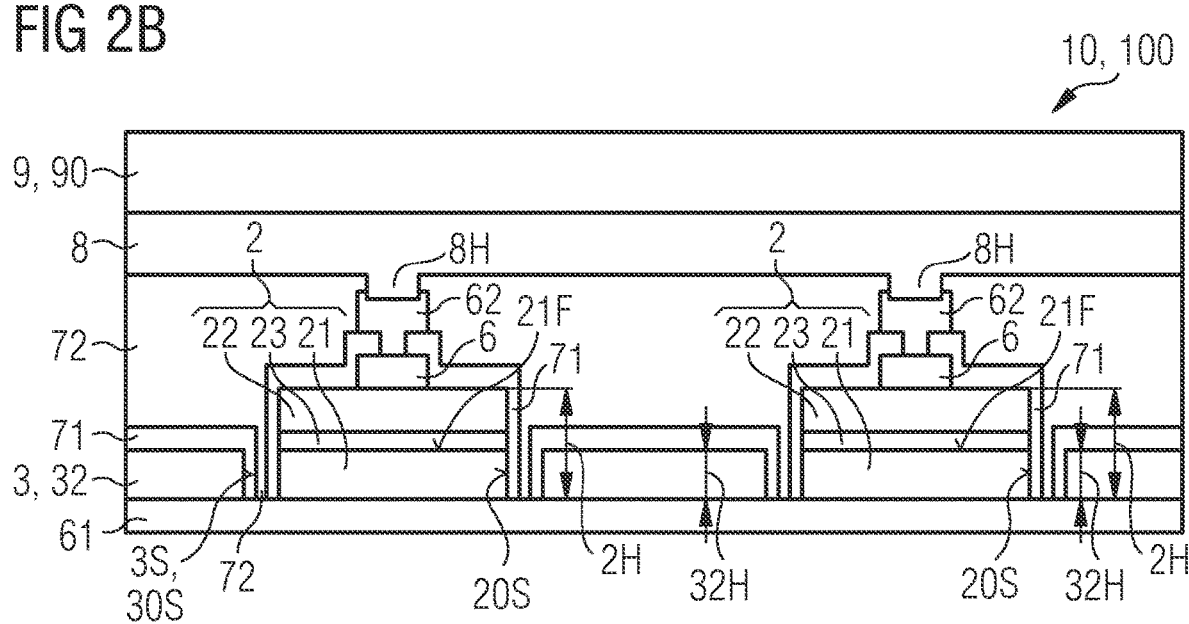
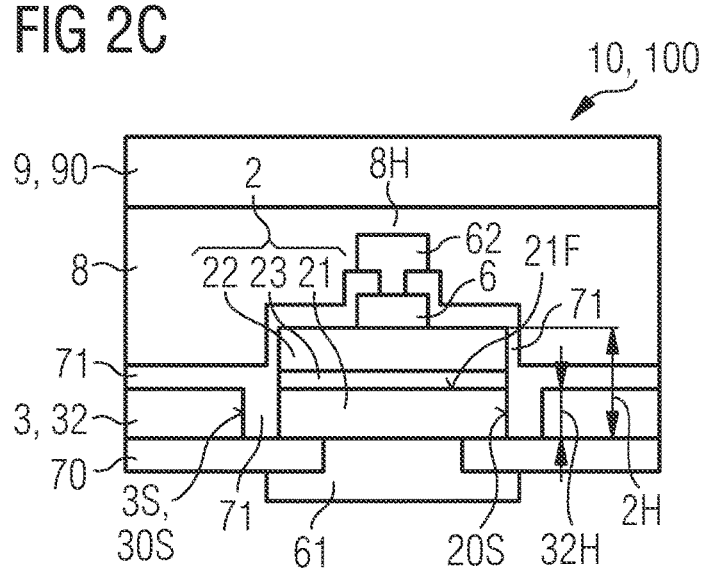

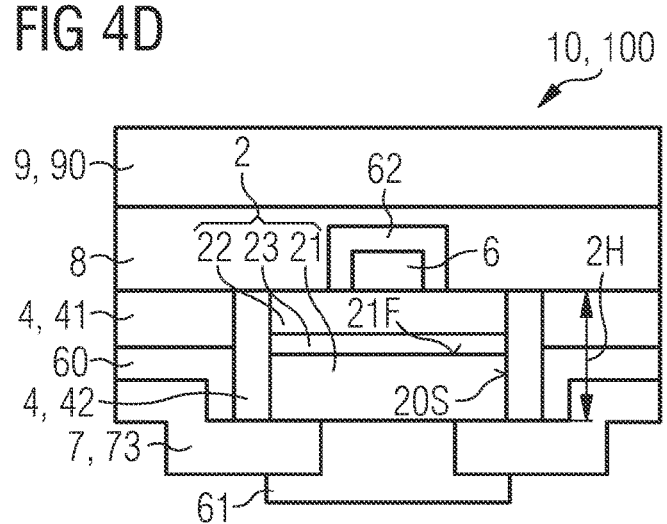
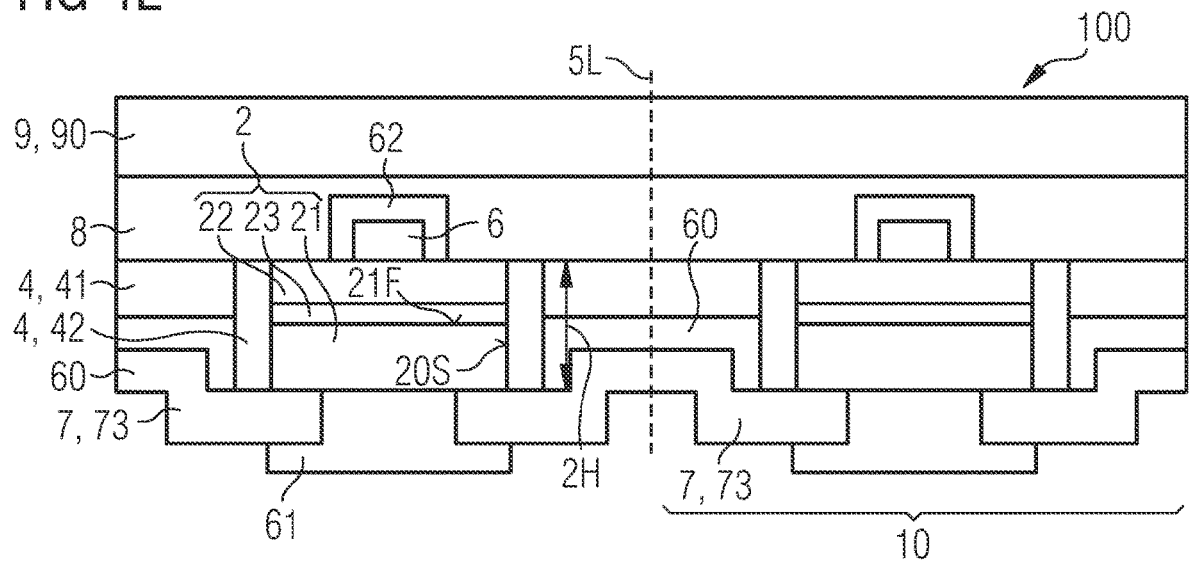

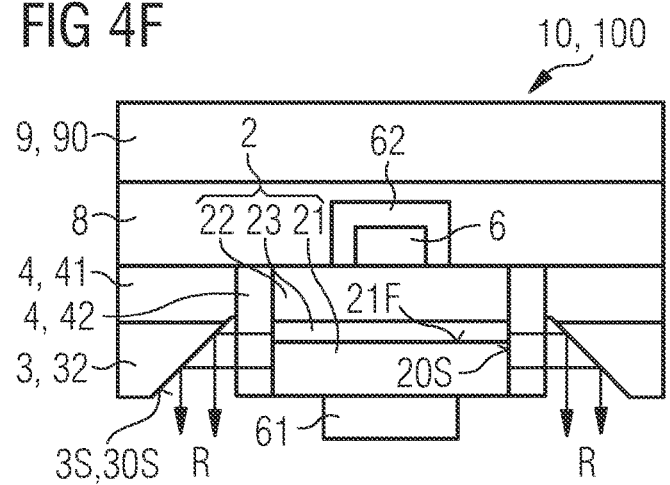
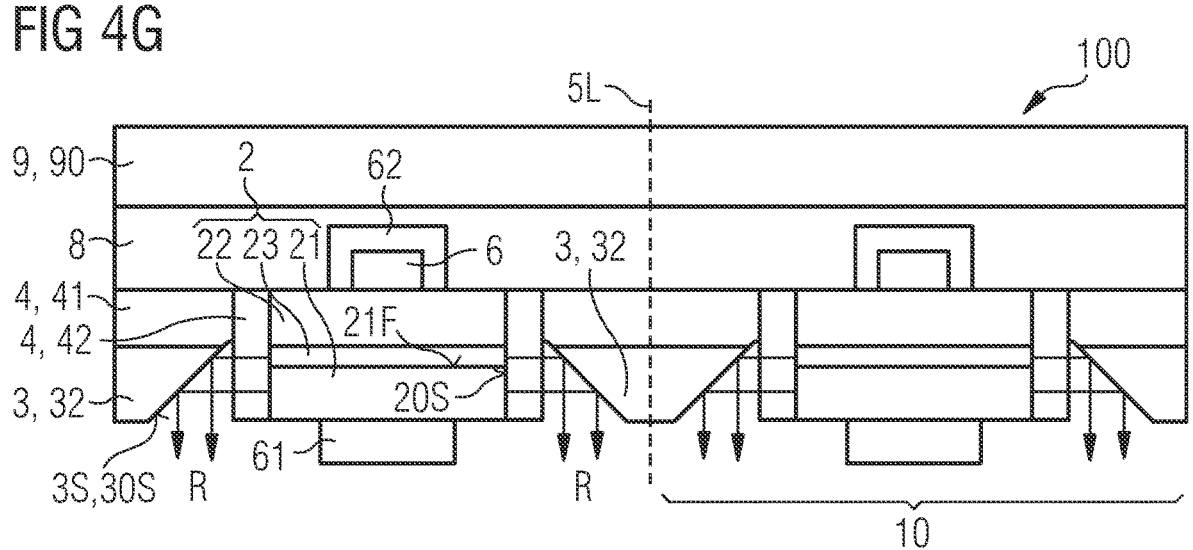

OPTOELECTRONIC COMPONENT, OPTOELECTRONIC COMPONENT GROUP IN BUFFER LAYER OPENING AND PRODUCTION METHOD FOR SAME

CROSS-REFERENCE TO RELATED APPLICATIONS

This application is a national stage entry according to 35 U.S.C. § 371 of PCT Application No. PCT/EP2019/060759 filed on Apr. 26, 2019, which claims priority to German Application No. 10 2018 110 344.1 filed on Apr. 30, 2018, both of which are herein incorporated by reference in their entirety.

TECHNICAL FIELD

A component and a component group including a number of components are specified. In addition, a method for the production of a component or of a component group including several components is specified.

BACKGROUND

The lateral structuring of an epitaxially grown semiconductor wafer during the processing of LEDs is usually done by dry chemical etching processes and can thus lead to the entry of defects into the light-active layers, which can impair the performance, especially the so-called low current efficiency and/or the aging stability of the finished LED component. The smaller the LED base area is formed, the more pronounced this effect is.

It may be desirable to specify efficient components or efficient group/composite of components, where the components are as free of defects as possible. In particular, the structuring of a light-active layer is done without dry etching processes which results in a reduction of defects. Furthermore, it may be desirable to specify a reliable and cost-efficient method for the production of a component or of a component group from such components.

These objects are solved by the method and the component according to the independent claims as well as in connection with such method or component. Further aspects and further developments of the method, the component or the component group are subject-matter of the further claims and the disclosure herein.

SUMMARY

In accordance with at least one aspect of a method for the production of a plurality of components and/or of a component group including a plurality of optoelectronic components, a growth substrate having a buffer layer arranged thereon is provided. The components are in particular optoelectronic components, such as LED components. The buffer layer is structured in such a way that it has a plurality of the openings which are spatially spaced from one another in lateral directions. The plurality of the semiconductor bodies is formed in the openings. particular, the semiconductor bodies are formed within the openings.

It is possible that the semiconductor bodies are located completely inside the openings or protrude beyond the openings along the vertical direction. The buffer layer has one or more subregions in the areas of the openings which are arranged in a vertical direction between the growth substrate and the semiconductor bodies. In particular, bottom surfaces of the openings are formed by surfaces of such inner subregions. The semiconductor body may have a first semiconductor layer of a first type of charge carrier and a second semiconductor layer of a second type of charge carrier.

A lateral direction is understood to mean a direction which is parallel to a main extension surface of the growth substrate or of a carrier of the component or of the component group. For example, the lateral direction is parallel to a semiconductor layer of the semiconductor body of the component. A vertical direction is understood to mean a direction which is directed in particular perpendicular to the main extension surface of the growth substrate or of a carrier of the component or the component group. For example, the vertical direction is parallel to a growth direction of the semiconductor layers of the semiconductor body. The vertical direction and the lateral direction are in particular orthogonal to each other.

Before providing the growth substrate having the buffer layer arranged thereon, the buffer layer can be applied to, in particular grown up on the growth substrate using an epitaxy method. In particular after the structuring of the buffer layer, in the openings, the semiconductor bodies are grown on the subregions of the buffer layer by a further epitaxy method. The buffer layer and the semiconductor bodies can thus be formed with interruptions in two temporally staggered method steps on the same growth substrate. In other words, the buffer layer can first be grown on the growth substrate. After the buffer layer has been patterned, the semiconductor bodies can be regrown in the areas of the openings of the buffer layer, for example, they can be regrown exclusively in the areas of the openings of the buffer layer.

According to at least one aspect of the method, the growth substrate is detached from the semiconductor bodies. In particular, the buffer layer is removed at least in the areas of the subregions. For example, the subregions are removed or thinned in such a way that the semiconductor bodies, in particular the first semiconductor layers of the semiconductor bodies, are thereby exposed at least in places or completely.

In at least one aspect of a method for producing a plurality of optoelectronic components and/or a component group including of a plurality of optoelectronic components, a growth substrate having a buffer layer arranged thereon is provided. The to be produced component or components in particular include/s a semiconductor body having a first semiconductor layer, a second semiconductor layer and an intermediate active zone located therebetween. The buffer layer is structured in such a way that it has at least one opening or a plurality of the openings which are spatially spaced from one another in lateral directions. The semiconductor body or the plurality of the semiconductor bodies is/are formed in the opening or openings. The buffer layer has, in the area of the opening or in the areas of the openings, one or more subregions which is/are arranged in a vertical direction between the growth substrate and the semiconductor body or bodies. In a subsequent method step, the growth substrate is detached from the semiconductor body or bodies. The buffer layer can be removed at least in the area of the subregion or in the areas of the subregions.

The semiconductor bodies can be grown selectively or spatially limited on the pre-structured buffer layer. In this sense, the semiconductor material of the semiconductor body can be grown locally restricted to the opening regions of the buffer layer which are not covered by a cover layer. At no time, the individual semiconductor body is singulated into smaller units. It is conceivable that the side surfaces and/or the semiconductor layers and/or the light-active layers, i.e. the active zones, of the semiconductor body are at no time exposed to a dry etching method and/or to a wet chemical etching method. The standard p-side dry etching method for forming individual semiconductor bodies from a common semiconductor body composite can be omitted, so that the dominant path of defect formation, in particular in the case of LEDs having an unfavorable circumferential to area ratio, is eliminated.

According to at least one aspect of the method, the buffer layer and the semiconductor body or bodies are based on the same compound semiconductor material, which may be a III-V or a II-VI compound semiconductor material. The semiconductor body and the buffer layer are based on the same compound semiconductor material if the materials of the semiconductor body and the buffer layer are based on the same compound semiconductor material, for example on a nitride, arsenide or phosphide compound semiconductor material. Here, the materials of the semiconductor body and the buffer layer need not be identical.

If the semiconductor body and the buffer layer are based, for example, on the same III-V semiconductor material, the semiconductor body and the buffer layer have at least one identical element from the third main group, such as B, Al, Ga, In, and one identical element from the fifth main group, such as N, P, As. It is possible for the semiconductor body and the buffer layer to contain different dopants and/or different additional constituents. For example, the buffer layer and the semiconductor body include or consist of $In_nAl_mGa_{1-n-m}N$, where $0 \leq n \leq 1$, $0 \leq m \leq 1$ and $n+m \leq 1$.

According to at least one aspect of the method, the semiconductor bodies each have a vertical height and the openings each have a vertical depth, wherein a ratio of the vertical height of one semiconductor body to the vertical depth of the opening of the corresponding semiconductor body is between 0.5 and 10 inclusive. In particular, this ratio may be between 0.5 and 5 inclusive, between 0.5 and 3 inclusive, between 0.5 and 1 inclusive, between 1 and 10 inclusive, between 1 and 5 inclusive or between 1 and 3 inclusive. The semiconductor bodies may be different from the so-called nano-rods and are, for example, formed with regard to their cross-sectional size in such a way that the semiconductor bodies can each be individually electrically contacted. For example, the semiconductor bodies have an average lateral expansion greater than 1 µm, 5 µm, 10 µm, 50 µm or greater than 100 µm. For example, a lateral cross-section of the semiconductor body and a lateral cross-section of the corresponding opening can have the same geometry. It is possible for the semiconductor body and the buffer layer to be based on the same compound semiconductor material.

According to at least one aspect of the method, the semiconductor bodies and the buffer layer are based on a semiconductor material having a hexagonal wurtzite crystal structure. For example, at least one vertical side surface or all vertical side surfaces of the semiconductor bodies and/or of the openings is/are parallel to an m-face or to an a-face of the hexagonal wurtzite crystal structure of the semiconductor material. In particular, the buffer layer, the first semiconductor layer, the second semiconductor layer and the active zone are each based on a III-V or II-VI compound semiconductor material of a hexagonal wurtzite crystal structure.

Three crystal directions are particularly relevant for the identification of a hexagonal wurtzite crystal structure, namely the c-direction, i.e. the <0001>-direction, the a-direction, i.e. the <-2110>-direction, and the m-direction, i.e. the <1-100>-direction. The notation <hkil> denotes all directions symmetrically equivalent to the vector [hkil]. The c-direction, the a-direction and the m-direction are perpendicular to a c-face, a-face and m-face of the crystal structure, respectively. In other words, the c-surface, the a-surface and the m-face are each perpendicular to the corresponding c-, a- and m-direction, respectively. Symmetrically equivalent directions or symmetrically equivalent faces are obtained in the hexagonal crystal system by permuting the first three indices in [hkil] or (hkil). The group of symmetrically equivalent a- or m-faces can be given by the notation {−2110} or {1-100}.

If all vertical side surfaces of the semiconductor body or of the opening each run parallel to an a-face or to an m-face, the semiconductor body or the opening can, for example in a top view of the c-face of the buffer layer, have a lateral basis in the form of a hexagon with all internal angles of 120°, in particular of a regular hexagon, an equilateral triangle or a trapezoid or parallelogram for instance with at least an internal angle of 60° or 120°, or of a rhombus with an acute internal angle of 60°, or of an isosceles trapezoid, for example with an internal angle of 60° or 120°. The triangle, hexagon, trapezoid, parallelogram or rhombus can exclusively have internal angles which are 60° and/or 120°. The hexagon with all internal angles of 120° may have two sides or edges of different lengths that are adjacent to each other. In the case of a regular hexagon, all sides or edges are of equal length.

Deviating from this, it is possible that the semiconductor body and/or the opening has/have a lateral cross-section of any geometry, for example in the form of a circle, an ellipse, a polygon, for example in the form of a quadrilateral, in particular a rectangle.

According to at least one aspect of the method, the semiconductor body is based on a nitride compound semiconductor material. In this case, the semiconductor layers of the semiconductor body can each be formed from GaN, InGaN, AlGaN and/or AlInGaN. Gallium nitride crystallizes in the hexagonal wurtzite structure and is therefore a hexagonal wurtzite crystal. For example, the buffer layer is an intrinsic GaN layer.

According to at least one aspect of the method, in a plan view of the growth substrate, the semiconductor bodies are grown exclusively within the openings on the buffer layer. In particular, the semiconductor bodies are grown separately from each other on the buffer layer. This can be achieved by covering the buffer layer at least outside the openings for instance with a covering material, for example with an oxide material, before the semiconductor bodies are applied. In this case, the semiconductor material is only deposited at those places inside the openings which are not masked by the covering material. The covering material can be formed or consist of $SiO_2$, $Si_xN_y$, $Al_2O_3$ and/or other dielectrics.

According to at least one aspect of the method, a cover layer is structured before the semiconductor bodies are formed on the buffer layer in such a way that the cover layer completely or substantially completely covers the buffer layer outside the openings and/or along the side surfaces of the openings. The side surfaces of the openings are formed in particular by side surfaces of the cover layer. The cover layer may be formed from the above-mentioned covering material. The openings have bottom surfaces which are not covered or only partially covered by the cover layer at their edges. The semiconductor bodies can then be grown on the bottom surfaces of the openings which are not covered or only partially covered by the cover layer, in particular they can be grown in a spatially restricted manner. The cover layer has partial layers which can cover, in particular completely cover, the side walls of the openings. In the lateral directions, the partial layers are each arranged for instance between a semiconductor body and a subregion of the buffer layer surrounding the semiconductor body. In the lateral directions, the semiconductor body can be completely enclosed by the corresponding partial layer of the buffer layer.

According to at least one aspect of the method, the bottom surfaces of the openings are formed by surfaces of the buffer layer. The openings can be formed in such a way that the buffer layer has further subregions surrounding the semiconductor body outside the openings, wherein the openings of the buffer layer are spaced apart from one another in lateral directions by the further subregions. The semiconductor bodies in the openings can thus be formed spatially separated from one another. In the lateral directions, the semiconductor bodies are spatially spaced apart in particular by the further subregions, i.e. by the outer subregions of the buffer layer.

According to at least one aspect of the method, the first semiconductor layer is formed in such a way that it has a surface facing away from the growth substrate which is curved or angled to increase its total surface area. This can be achieved in particular by adjusting the growth parameters. The active zone can be formed on the first semiconductor layer, in particular directly on the first semiconductor layer. In particular, the active zone follows a contour of the surface of the first semiconductor layer.

According to at least one aspect of the method, before the growth substrate is removed, the semiconductor bodies are mechanically connected to a common carrier by a connection layer. The semiconductor bodies are arranged in the vertical direction between the carrier and the growth substrate. Immediately after the removal of the growth substrate, a component group including of a plurality of individually electrically contactable optoelectronic components can be formed on the common carrier. After the removal of the growth substrate, surfaces of the first semiconductor layers of the semiconductor bodies can be partially exposed, in particular at the locations of the subregions of the buffer layer between the growth substrate and the semiconductor bodies. Since the semiconductor bodies are laterally spaced from one another, they can be made electrically contactable individually or in groups by applying contact layers to the exposed surfaces of the first semiconductor layers.

The connection layer can be formed to be electrically conductive. Via the connection layer, the semiconductor bodies can be electrically conductively connected, for example, to electrical conductor tracks on the carrier and/or to electrical circuits or transistors arranged on the carrier or integrated in the carrier. It is also possible that the connection layer is formed to be electrically insulating.

According to at least one aspect of the method, the component group is singulated along separating lines into individual components or into groups of individual components. The singulated group of individual components can still be coherent and can form one component which is for example an LED array. The separating lines run in particular between the semiconductor bodies and may be spaced apart from the semiconductor bodies. As a result of which separating trenches are formed which are located sidewards of the semiconductor bodies and therefore do not extend throughout the semiconductor body or throughout the semiconductor bodies. In other words, the respective semiconductor bodies themselves are not exposed to a singulation process, since during their formation, the semiconductor bodies have been grown up separately from one another.

Defect-inducing etching processes, in particular defect-inducing dry etching processes, which are carried out directly on the semiconductor body or on the semiconductor bodies, can be dispensed with. Thus, during the singulation, it is possible that the side surfaces of the semiconductor bodies—at no time—are exposed to an etching method, in particular to a dry etching method.

According to at least one aspect of the method, the semiconductor bodies are mechanically connected to a common carrier by a connection layer before the growth substrate is removed. The semiconductor bodies are arranged in the vertical direction between the carrier and the growth substrate. For example, the connection layer has a plurality of retaining elements which are arranged between the components and the common carrier. For example, the retaining elements may be formed as predetermined breaking points of the connection layer, wherein the retaining elements release the components under mechanical load so that the components can be detached from the common carrier and are therefore formed to be transferable.

According to at least one aspect of the method, the connection layer is arranged in the vertical direction at least in places between a dissolvable intermediate layer and the common substrate. The intermediate layer can be selectively removed, in particular by an etching method. In other words, the intermediate layer may be formed as a removable sacrificial layer, which can be removed from the semiconductor bodies and/or from the carrier, for example by an etching method, in particular by a selective etching method. After the removal of the intermediate layer, the components can be mechanically connected to the connection layer exclusively via the retaining elements. particular, the components are mechanically connected to the common carrier exclusively via the retaining elements and the connection layer.

According to at least one aspect of the method, the buffer layer is completely removed. After detaching the growth substrate, the first subregions between the growth substrate and the semiconductor bodies are completely removed, in particular mechanically and/or chemically. Subsequently, the remaining subregions of the buffer layer, which laterally enclose the semiconductor bodies, can be completely removed, in particular by a wet chemical etching method. The side surfaces of the respective semiconductor body are passivated in particular with insulating layers. The lateral passivation of the semiconductor bodies can be carried out partly before the growth substrate is detached or before the buffer layer is completely removed and partly after the growth substrate is detached or after the buffer layer is completely removed. A component or a group of a plurality of components, the component or components being produced by the method described in this paragraph, is thus free from the buffer layer.

Alternatively, it is possible that parts of the buffer layer, in particular the outer subregions of the buffer layer enclosing the semiconductor bodies, remain for instance partially on the components. The remaining subregions can be formed to reflect radiation, provided with a reflection layer and/or structured.

In at least one aspect of a component, it has a semiconductor body and a buffer layer. The semiconductor body includes a first semiconductor layer, a second semiconductor layer and an active zone located therebetween. The semiconductor body and the buffer layer, for instance, are based on the same compound semiconductor material. The buffer layer has an opening, wherein in a plan view, the semiconductor body is located in the opening. The buffer layer surrounds the semiconductor body in lateral directions. For example, the semiconductor body is completely surrounded by the buffer layer in lateral directions. The buffer layer can be electrically isolated from the semiconductor body. The semiconductor body may have been originally grown on a subregion of the buffer layer, wherein this subregion of the buffer layer is subsequently removed. The remaining subregion of the buffer layer laterally surrounding the semiconductor body and the semiconductor body may therefore be based on the same semiconductor material and/or have a similarly large lattice constant. For example, the lattice constant of the buffer layer and the lattice constant of the semiconductor body or of the first semiconductor layer differ from each other by at most 15%, for instance by at most 10% or at most 5% or at most 1%.

According to at least one aspect of the component, the semiconductor body is grown in the opening of the buffer layer. The semiconductor body has side surfaces which are in particular free of singulation tracks, for example free of mechanical singulation tracks, and/or structuring tracks.

According to at least one aspect of the component, the buffer layer has side surfaces facing the semiconductor body which are formed to reflect radiation. The buffer layer itself can be formed to be radiation-reflective. It is also possible that the side surfaces of the buffer layer are provided with reflection layers.

In at least one aspect of a component group including a plurality of components described in particular here, the buffer layers of the components form a common buffer layer which is, for example, formed contiguously and has a plurality of the openings, wherein the semiconductor bodies of the components in each case are arranged in one of the openings. The components of the component group can be formed to be individually electrically contactable. For example, the components are arranged on a common carrier. The common carrier is in particular different from a growth substrate. For example, the components form a row and/or a column on the common carrier. Each of the components can have a diode structure, especially an LED structure. It is possible that the components are arranged matrix-like on the common carrier. In this case the component group can have a plurality of rows and/or a plurality of columns of the components. In particular, the components can be electrically controlled independently from each other. It is also possible that the components are electrically connected in series or parallel to each other.

According to at least one aspect of the component group, the components are fixed to a common carrier by means of a connection layer. The connection layer may have a plurality of retaining elements which are arranged between the components and the common carrier. For example, the retaining elements are formed as predetermined breaking points of the connection layer. The retaining elements can release the components, especially under mechanical load, so that the components can be detached from the common carrier and in this way are formed to be transferable.

According to at least one aspect of the component group, the connection layer is arranged in the vertical direction at least in places between a dissolvable intermediate layer and the common carrier. After the removal of the intermediate layer, the components are mechanically connected to the connection layer, for example, exclusively via the retaining elements and/or to the common carrier exclusively via the retaining elements and the connection layer. By breaking the retaining elements, the components can be removed from the common carrier individually or in groups.

The method described here is particularly suitable for the production of a component, component or component group described here. The features described in connection with the component or component group can therefore also be used for the method, and vice versa.

BRIEF DESCRIPTION OF THE DRAWINGS

In the following, the components and the methods described herein are explained in more detail in conjunction with non-limiting aspects and the associated figures.

FIGS. 1A, 1B, 1C, 1D, 1E, 1F, 1G, 1H, 1I, 1J, 1K, 1L, 1M, 1N and 1O show schematic illustrations of some method steps of an exemplary aspect of a method for the production of a component group, a component or a plurality of components, FIGS. 2A, 2B and 2C show schematic illustrations of some exemplary aspect of a component group or component, FIGS. 4A, 4B, 4C, 4D, 4E, 4F, 4G, 5A, 5B, 5C, 6A, 6B, 6C, 6D, 6E, and 6F show schematic illustrations of various method steps of further exemplary aspects of a method for producing a component group, a component or a plurality of components.

Figure 1A:
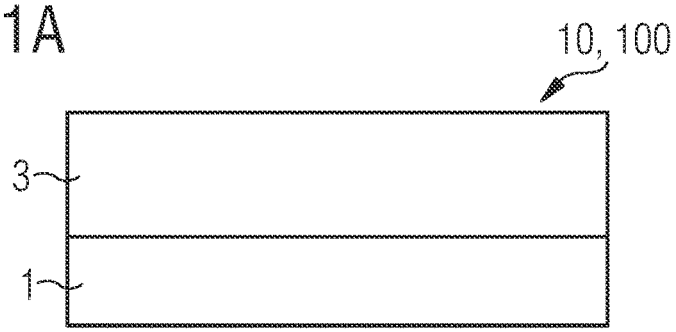

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION

For producing a component 10 or a component group 100, according to FIG. 1A, a growth substrate 1 having a buffer layer 3 arranged thereon is provided. The growth substrate can be a sapphire substrate. The buffer layer 3 can be a light-inactive layer of a III-V compound semiconductor material. For example, the buffer layer 3 is an intrinsic gallium nitride layer.

The buffer layer 3 has a vertical layer thickness which is for instance between 1 µm and 10 µm. For example, the buffer layer 3 is epitaxially grown on the growth substrate 1. Along a growth direction, i.e. along the vertical direction, the buffer layer can vary in its composition. For example, the buffer layer 3 has a lower region facing the growth substrate 1, wherein the lower region of the buffer layer 3 serves as a growth layer for the subsequent overgrowth of the semiconductor bodies 2.

The buffer layer 3 can have an upper region facing away from the growth substrate 1, wherein the upper region can take over further functions with regard to wave-guiding or lateral restricting the layer growth of the semiconductor bodies 2. The material composition of the buffer layer 3 along the vertical direction can be tailored to the different functions of the buffer layer 3 mentioned above.

Figure 1B:
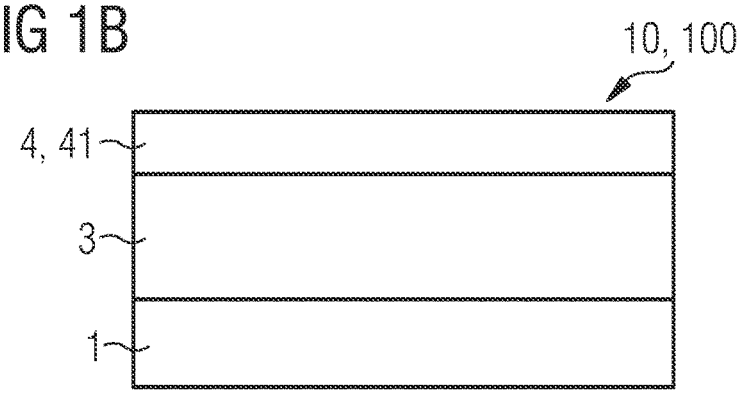

According to FIG. 1B, a cover layer 4 is applied to the buffer layer 3. The cover layer 4 is formed in particular as a mask layer. The cover layer 4 is formed, for example, from silicon dioxide.

Figure 1C:
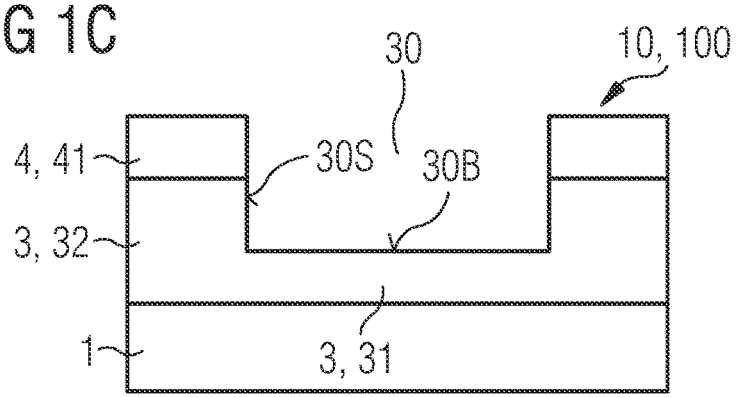

As shown in FIG. 1C, the cover layer 4 is structured using a resist mask, for example. The cover layer 4 forms for instance a hard mask 41 in particular made of SiO2. For example, using a dry chemical etching method, especially using chlorine plasma, openings 30 are etched into the buffer layer 3. The shape and size of the openings can correspond to those of the later components 10 or the semiconductor body 2.

The components 10 may be optoelectronic components configured to generate or detect electromagnetic radiation. In particular, the components to be produced are light-emitting diodes 10. The opening 30 is formed in particular as a recess of the buffer layer 3. The opening 30 has a bottom surface 30B and side surfaces 30S. For example, the bottom surface 30B is formed by a surface of a first subregion 31 of the buffer layer 3, wherein the first subregion 31 is located in the area of the opening 30. The buffer layer 3 has further subregions 32 outside the opening 30 or outside the openings 30, wherein the further subregions 32 each enclose an opening 30 in the lateral directions. The first subregion 31 can be referred to as the inner subregion of the buffer layer 3, while the further subregions 32 can be referred to as the outer subregions of the buffer layer 3.

In a plan view of the growth substrate 1, the opening 30 can have any geometry. The geometry of the opening 30 determines in particular the geometry of a semiconductor body 2 of the component 10 which is to be produced. In a plan view, the opening 30 can have the shape of a triangle, quadrilateral, hexagon or circle. For example, at least one side surface 30S or all side surfaces 30S of the opening 30 runs/run parallel to an m-face or to an a-face of a hexagonal wurtzite crystal lattice of the material of the buffer layer 3. This can be achieved, for example, by subsequent wet chemical etching over a sufficiently long etching time, for example with TMAH, KOH, NH4OH.

Figure 1D:
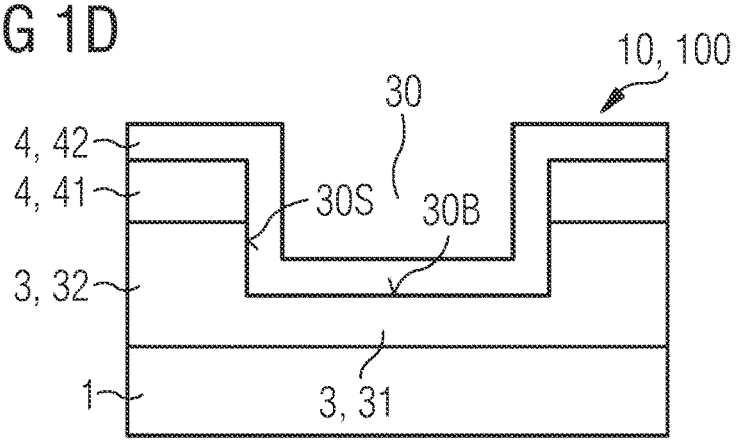

The hard mask layer 41 forms a first partial layer 41 of the cover layer 4. According to FIG. 1D, a second partial layer 42 is applied to the first partial layer 41 and to the bottom surface 30B or to the bottom surfaces 30B of the openings 30. The second partial layer 42 of the cover layer 4 in particular completely covers the side surfaces 30S of the opening 30 or of the openings 30. For example, the second partial layer 42 of the cover layer 4 is a SiO2 layer. The second partial layer 42 can have an average layer thickness between 50 nm and 1500 nm inclusive, in particular between 200 nm and 700 nm inclusive. For example, the average thickness of the second partial layer 42 of the cover layer 4 is about 500 nm.

Figure 1E:
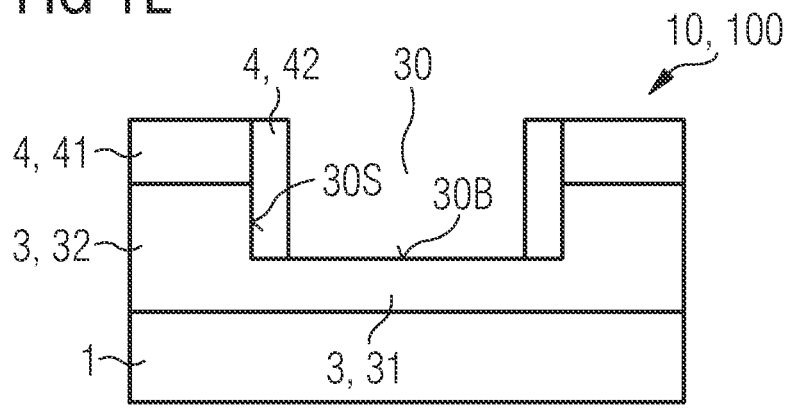

According to FIG. 1E, the second partial layer 42 of the cover layer 4 can be opened, for example, using a self-adjusting dry etching method analogous to the spacer technology in the area of the opening 30 or in the areas of the openings 30. The structuring of the second partial layer 42 may be carried out in such a way that the second partial layer 42 remains at least on the side surfaces 30S of the opening 30. According to the spacer technology, the cover layer 4 is removed everywhere except for the side surfaces. Alternatively, the second partial layer 42 of the cover layer 4 can be opened using photo technology in the area of the opening 30 or in the areas of the openings 30 (see FIG. 8A). Using the photo technique, the cover layer 4 is only removed in the area of the opening 30. It is possible for an edge region of the cover layer 4 to remain within opening 30. In other words, the side surfaces 30S of the opening 30 (here using the spacer method) or the side surfaces 30S of the opening 30 and the first partial layer 41 of the cover layer 4 outside the openings 30 and a small area of the bottom surface 30B (here using the photographic technique) are covered by the remaining second partial layer 42.

In particular, FIG. 1E shows only a section of a wafer or wafer. The wafer may have a plurality of the openings 30 shown in FIG. 1E.

Figure 1F:
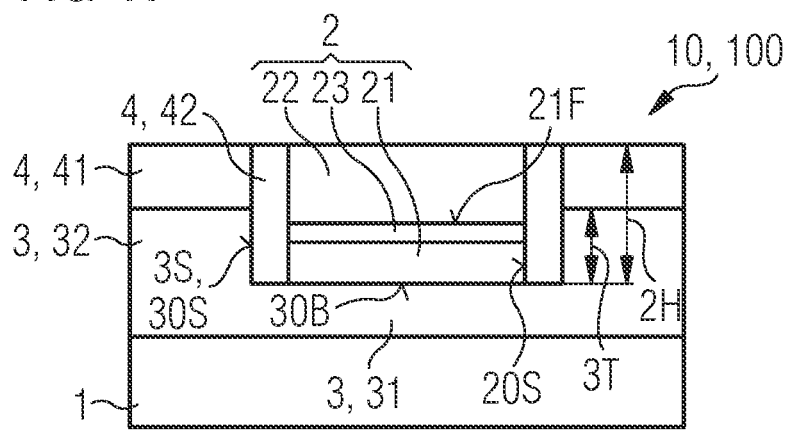

According to FIG. 1F, at least one semiconductor body 2 is formed in opening 30. The semiconductor body 2 includes a first semiconductor layer 21, a second semiconductor layer 22 and an active zone 23 disposed between the first semiconductor layer 21 and the second semiconductor layer 22. The active zone is configured in particular for the generation of electromagnetic radiation. The first semiconductor layer 21 is formed in particular to be n-conductive. The second semiconductor layer 22 may be p-conductive. The first semiconductor layer 21 has a surface 21F facing the active zone 23 or the second semiconductor layer 22. In FIG. 1F, the surface 21F is flat. According to FIG. 1F, the semiconductor body 2 completely fills the opening 30 of the buffer layer 3 and the cover layer 4.

According to FIG. 1F, the semiconductor body 2 is grown only on the exposed surface 30B of the opening 30. Due to the growth rate which depends on the bottom face, an epi-layer is grown only in those areas which are not masked by the cover layer 4, in particular by the first partial layer 41 and/or the second partial layer 42 of the cover layer 4. In other words, the semiconductor body 2 is formed only in the opening 30. Deviating from FIG. 1F, a plurality of the semiconductor bodies 2 can be formed in different openings 30.

According to FIG. 1F, the opening 30 of the buffer layer 3 has a vertical depth 3T. The semiconductor body 2 has a vertical height 2H. A ratio of the vertical height 2H of the semiconductor body 2 to the vertical depth 3T of the buffer layer 3 can be between 0.5 and 10 inclusive, for example between 0.5 and 5 inclusive. According to FIG. 1E, the bottom surface 30B is free of a step formed for instance by the second partial layer 42 of the cover layer 4. The semiconductor body 2 formed in this opening 30 may have side surfaces 20S which directly adjoin the second partial layer 42 and are free of steps. The side surfaces 20S of the semiconductor body 2 and the side surfaces 30S of the opening 30 can therefore have identical crystal orientations.

Along the lateral directions, the second partial layer 42 does not extend into the semiconductor body 2, which means that the crystalline quality of the light-active semiconductor layers of the semiconductor body 2 is not negatively affected. According to FIG. 1F, the opening of the buffer layer 3 and of the cover layer 4 is completely filled up by the semiconductor layers of the semiconductor body 2. Alternatively, it is generally possible, however, that there is a lateral gap located between the semiconductor body 2 and the partial layer 42.

Figure 1G:
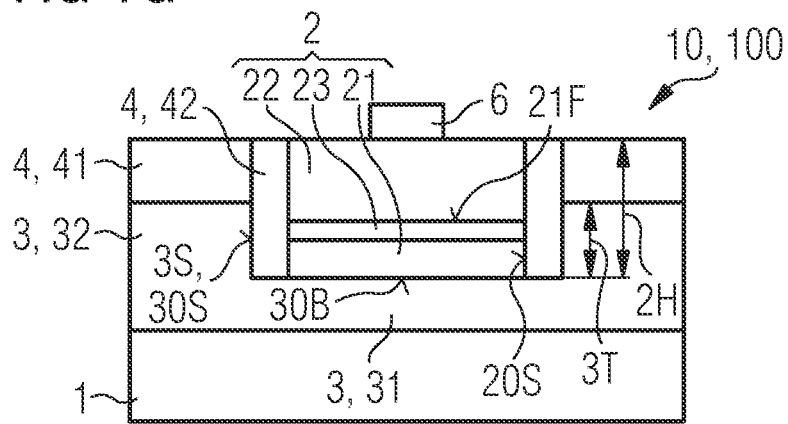

According to FIG. 1G, a mirror layer 6 is formed on a surface of the second semiconductor layer 22. In FIG. 1G, the mirror layer 6 covers the semiconductor body 2 only in places. Deviating from this, it is possible that the mirror layer 6 completely covers the semiconductor body 2 in top view. The mirror layer 6 may include or be formed from a metal such as silver or aluminum or platinum or palladium or gold or combinations thereof and/or dielectric layers.

Figure 1H:
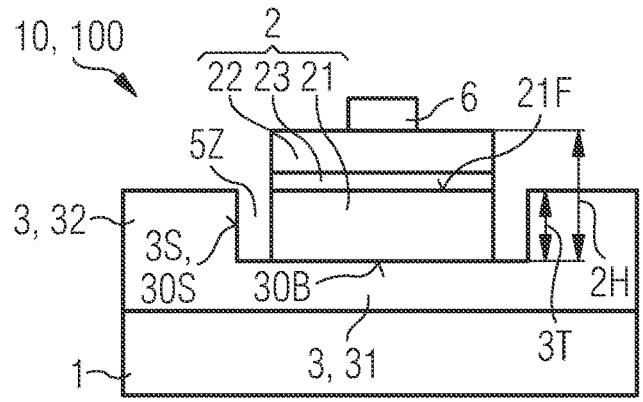

As shown in FIG. 1H, the cover layer 4 having the first partial layer 41 and the second partial layer 42 is removed, for example by wet chemical removal using a BOE ("Buffered Oxide Etch"). After removing the cover layer 4, the side surfaces 20S of the semiconductor body 2 can be reprocessed, if necessary, using a suitable wet chemical etching method.

Figure 1I:
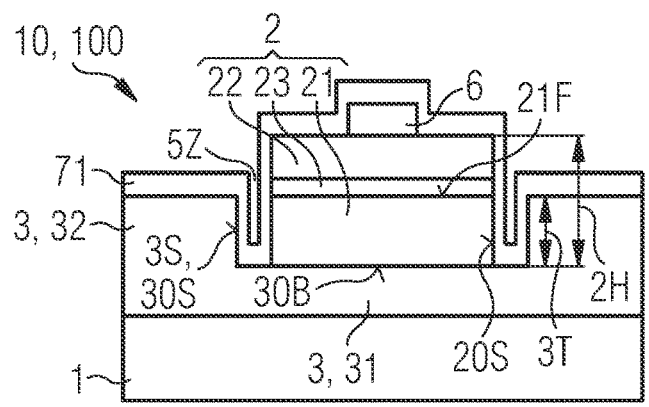

According to FIG. 1I, the side surfaces 20S are passivated by a first insulating layer 71. The insulating layer 71 may cover, in particular completely cover, the side surfaces 20S of the semiconductor body 2, the side surfaces 30S of the opening 30, the side surfaces 3S of the buffer layer 3 and/or exposed surfaces of the buffer layer 3 and the semiconductor body 2 and/or the mirror layer. The insulating layer 71 may be formed from a dielectric, for example SiO2, Si3N4, SixOyNz, Al2O3, Ta2O5 or from similar materials. Because of its good over-molding properties, the ALD (Atomic Layer Deposition) method may be used.

According to FIG. 1I, the first insulating layer 71 is formed in such a way that it covers, in particular completely covers, the side surfaces 20S of the semiconductor body 2 and/or of the side surfaces 3S or 30S of the buffer layer 3 or of the opening 30, wherein an intermediate region 5Z is formed which is located in the lateral directions between the side surfaces 20S of the semiconductor body 2 and the side surfaces 30S of the opening 30. The intermediate region 5Z is in particular free from a material of the insulating layer 71. The intermediate region 5Z forms in particular a gap between the semiconductor body 2 and the buffer layer 3.

Figure 1J:
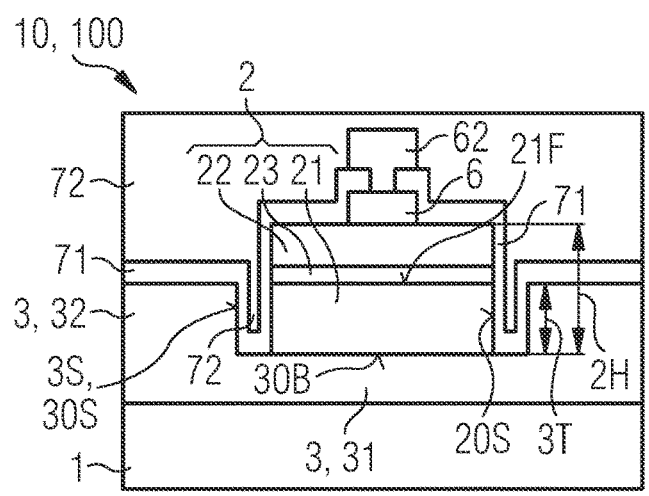
Figure 10:
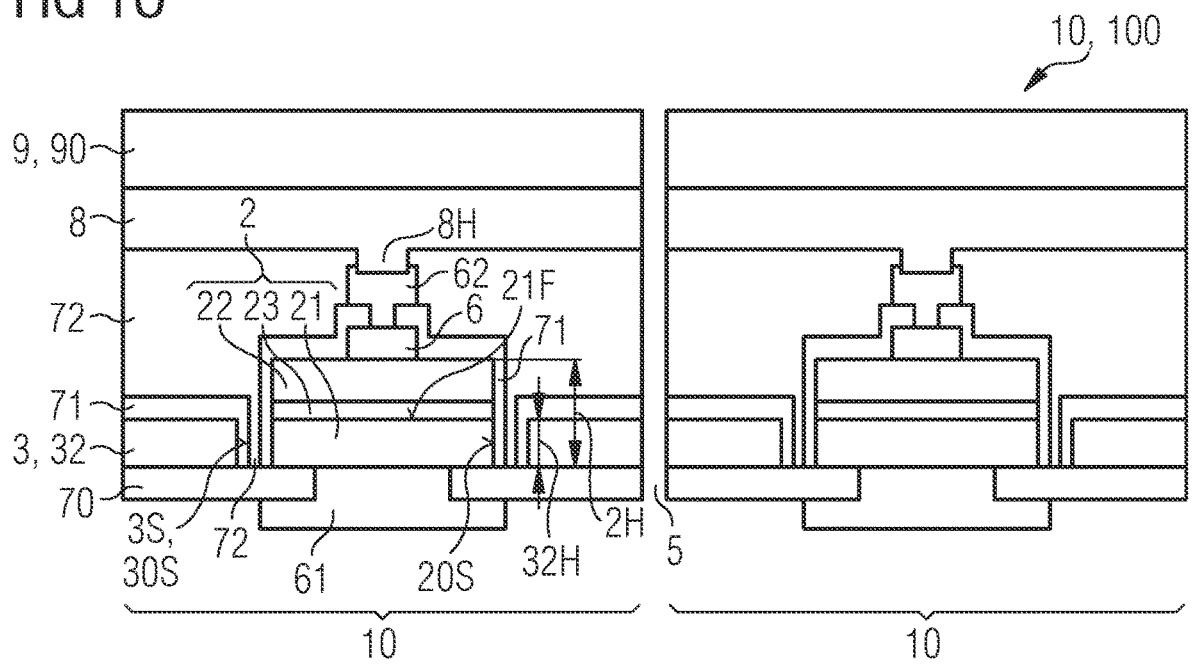
FIGS. 7A, 7B, 7C, 7D, 7E, 7F, 8A, 8B, 8C, 9A, 9B, 9C, 10A and 10B show further schematic illustrations of some method steps of further exemplary aspects of a method for the production of a component group, a component or a plurality of components.

According to FIG. 1J, the first insulating layer 71 is opened in the area of the mirror layer 6. A contact layer 62 is deposited on the mirror layer 6. The contact layer 62 forms in particular a second contact layer 62 of the component 10, wherein the second contact layer 62 is electrically conductively connected to the second semiconductor layer 22 of the semiconductor body 2 via the mirror layer 6.

A further insulating layer 72, namely a second insulating layer 72 may be applied to the first insulating layer 71 over the entire surface. The intermediate region 5Z can be completely covered by the second insulating layer 72. In a plan view of the growth substrate 1, the second insulating layer 72 can cover, in particular completely cover the first insulating layer 71, the semiconductor body 2, the mirror layer 6 and the second contact layer 62. The second insulating layer 72 may be a silicon oxide layer.

According to FIG. 1K, the second insulating layer 72 is opened in the areas of the second contact layers 62. Via a connection layer 8, the semiconductor body 2 or a plurality of the semiconductor bodies 2 can be mechanically connected to a carrier 9 or to a common carrier 90. The connection layer 8 can completely cover the openings of the second insulating layer 72. In the areas of the second insulating layer 72, the connection layer 8 can have a plurality of retaining elements 8H which adjoin, in particular directly adjoin, the contact layers 62. The connection layer 8 can be electrically conductive or electrically insulating. The carrier 9 or the common carrier 90 may have electrical conductor paths and/or transistors arranged on the carrier 9 or 90 or integrated in the carrier 9 or 90. The electrical conductor paths and/or the transistors are electrically conductively connected, in particular via the electrically conductive connection layer 8, to the second contact layers 62 of the components 10. The connection layer 8 can be structured for the purpose of individually contacting the components 10.

According to FIG. 1L, the growth substrate 1 is separated from the semiconductor body 2 or from the semiconductor bodies 2. Removal of the growth substrate 1 can be performed by a mechanical, chemical or laser lift-off method. After detaching the growth substrate 1, the buffer layer 3 can be removed at least in the areas of the inner subregions 31 for instance completely and/or in the outer subregions 32 for instance partially. The buffer layer 3 can be thinned down to the first semiconductor layer 21 by grinding or polishing, for example. As a result, the buffer layer 3 is no longer contiguous so that the semiconductor bodies 2 are electrically separated from one another by the absence of a contiguous buffer layer 3. By thinning the buffer layer 3, the buffer layer 3 is divided into a plurality of outer subregions 32 which surround the spaced apart semiconductor bodies 2 in the lateral directions. In particular, the outer subregions 32 continue to be formed in a contiguous manner with inner openings, wherein in a plan view, the semiconductor bodies 2 are arranged in the inner openings. The outer subregion 32 of the buffer layer 32 has a vertical height 32H, which corresponds for instance to the depth 3T of the opening 30. It is possible that the vertical height 32H is smaller than the original depth 3T, for example at most 50%, 30%, 15%, 10% or at most 5% smaller.

According to FIG. 1L, the buffer layer 3 is thinned down to the intermediate regions 5Z, i.e. until partial exposure of the second insulating layer 72 and/or of the intermediate region 5Z. The first insulating layer 71, which was previously formed in a contiguous manner, is now divided into a plurality of laterally spaced partial layers of the insulating layer 71. Deviating from this, it is possible that the insulating layer 71 remains contiguous after the partial removal of the buffer layer 3.

According to FIG. 1M, a further insulating layer 70 is applied to the exposed buffer layer 3 and to the exposed first semiconductor layer 21 of the semiconductor body 2. The further insulating layer 70 serves in particular as final passivation of the component 10 or of the component group 100. The further insulating layer 70 can be opened in places to form first contact layers 61. The first contact layer 61 may be formed from a transparent and electrically conductive material (TCO), for example indium tin oxide. The further insulating layer 70, which serves as a final passivation, can be formed from a dielectric, for example from an oxide, such as silicon oxide, or from a nitride, such as Si3N4. It is possible that the insulating layer 70 is formed from several layers of different materials and/or compositions. Alternatively, it is possible that the component group 100 or the component 10 is free of such an insulating layer 70.

FIG. 1N shows a schematic sectional view of a component group 100. The component group 100 includes a plurality of semiconductor bodies 2 which are spaced apart from each other in the lateral direction. Each of the semiconductor bodies 2 is electrically contactable via a first contact layer 61. In the lateral directions, the first contact layers 61 are spatially spaced from each other. The component group 100 thus has a plurality of components 10, each of which has a semiconductor body 2 and a first contact layer 61. The components 10 thus are electrically individually connectable. It is possible that the components 10 have a first common contact and individually controllable second contacts. The component group 100 can have a common electrically conductive connection layer 8 which is in electrical contact with the second contact layers 62 of the components 10. The electrically conductive connection layer 8 thus forms a common electrode of the components 10.

It is possible that the component group 100 can be singulated along a plurality of separating lines 5L into a plurality of individual components 10 or into a plurality of rows or columns of components 10, wherein one row or column of components 10 forms a component which is, for example, an LED array. Such a singulation of the component group 100 is shown schematically in FIG. 1O by the formation of the separating trenches 5. Here, the separating trench 5 extends through the connection layer 8 and through the common carrier 90. The common carrier 90 is thereby divided into a plurality of carriers 9, wherein a single semiconductor body 2 or a plurality of the semiconductor bodies 2 can be arranged on each of the singulated carriers 9. The separating trench 5 may extend through all the other layers such as the buffer layer 3 and the insulating layers 70, 71 and 72.

For example, a single component 10 is shown schematically in FIG. 1M. The semiconductor body 2 is located within an opening 30 of the buffer layer 3, wherein in a plan view of the carrier 9, the semiconductor body 2 is enclosed by the buffer layer 3, in particular by the outer subregion 32 of the buffer layer 3. The buffer layer 3 and the semiconductor body 2 can be based on the same compound semiconductor material.

Figure 2A:
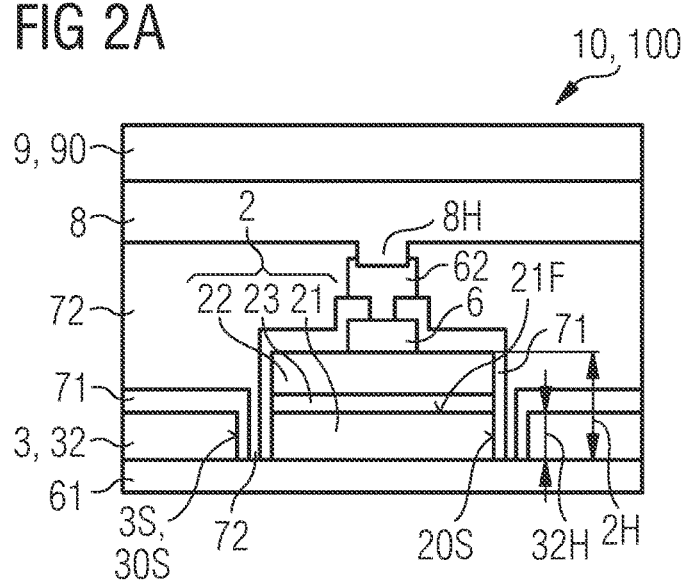

The exemplary aspect shown in FIG. 2A essentially corresponds to the exemplary aspect of a component 10 or of a component group 100 shown in FIG. 1M. In contrast to this, the first contact layer 61 is formed to be flat, wherein in a plan view of the carrier 90, the first contact layer 61 covers the semiconductor body 2 in particular completely. In particular, the first contact layer 61 directly adjoins the semiconductor body 2 or the semiconductor body 2. In this case, the insulating layer 70, which is formed as a final passivation, may be omitted.

It is possible that the first contact layer 61 is formed as a common contact layer for a plurality of the semiconductor bodies 2 or for all semiconductor bodies 2 of the component group 100. Such a design of the first contact layer 61 is shown for example in FIG. 2B. The component group 100 shown in FIG. 2B can be separated into a plurality of components 10 or into a plurality of rows or columns of components 10, i.e. into a plurality of components including a plurality of components 10, analogous to the exemplary aspects shown in FIGS. 1N and 1O. It is possible that the connection layer 8 is structured to trigger the components 10, in particular the individual components 10 in the component group, or that the components 10 are singulated.

The exemplary aspect shown in FIG. 2C essentially corresponds to the exemplary aspect shown in FIG. 1M for a component 10 or for a component group 100 including of a plurality of components 10. In contrast, the second insulating layer 72 is not present. This means that the second insulating layer 72, which is formed from SiO2, is not required, especially on the p-side, so that no photo technique or contact etching is required for the forming of a p-contact connection via a bonding metal.

In addition, between the side surface 20S of the semiconductor body 2 and the side surface 30S of the opening 30, there is no intermediate region 5Z which is free of a material of the first insulating layer 71. In other words, the first insulating layer 71 is formed such that it completely fills the intermediate region 5Z or the intermediate regions 5Z between the side surface 20S of the semiconductor body 2 and the side surface 30S of the opening 30. In FIG. 2B, the intermediate region 5Z is partially filled by the first insulating layer 71 and partially by the second insulating layer 72. Unlike in FIG. 1M, where the second insulating layer 72 is located between the first insulating layer 71 and the connection layer 8, the connection layer 8 according to FIG. 2C is in particular directly adjacent to the first insulating layer 71.

Deviating from the above figures, it is possible that the first insulating layer 71, which is formed as an ALD layer, is replaced by a dual or multiple layer sequence. The layer sequence can be composed of an insulating layer, a reflector layer and/or an absorption layer.

Figure 3A:
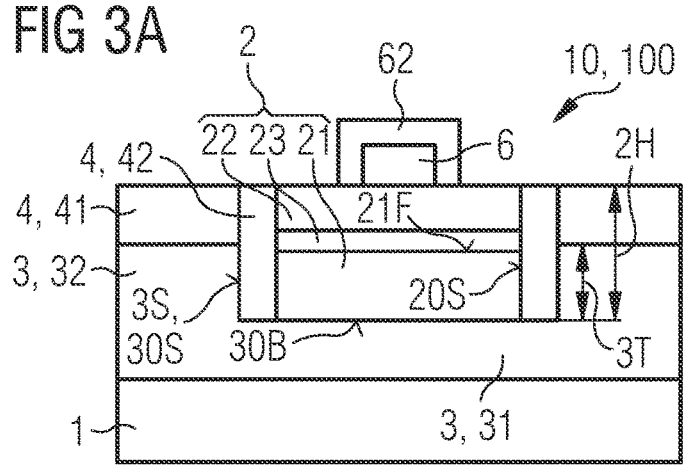
FIGS. 3A, 3B, 3C, 3D and 3E show schematic illustrations of some method steps of further exemplary aspects of a method for the production of a component group, a component or a plurality of components.

The exemplary aspect shown in FIG. 3A essentially corresponds to the exemplary aspect shown in FIG. 1G for a method step for producing a component 10 or a component group 100. In contrast to this, the second contact layer 62 is applied to the mirror layer 6 in such a way that the mirror layer 6 is completely surrounded by the second contact layer 62 in the lateral directions. Furthermore, in contrast to FIG. 1H, the cover layer 4 having the first partial layer 41 and the second partial layer 42 is not removed. In other words, the cover layer 4 remains on the component 10 or on the component group 100.

Figure 3B:
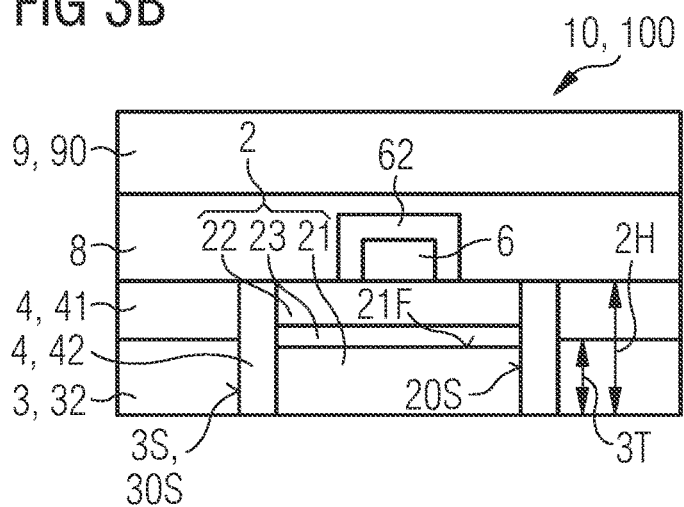
Figure 3C:
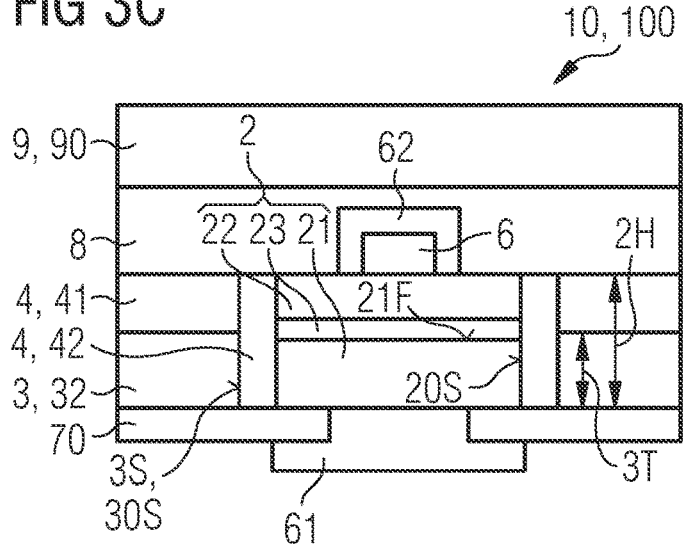

In FIGS. 3B and 3C, the semiconductor body 2 and the covering layer 4 and the buffer layer 3 are attached to a carrier 9 or to a common carrier 90 by the connection layer 8. Analogous to the exemplary aspect shown in FIG. 1M, a further insulating layer 70 is formed as a final passivation and a structured first contact layer 61 is formed on the buffer layer 3 and on the semiconductor body 2.

Figure 3D:
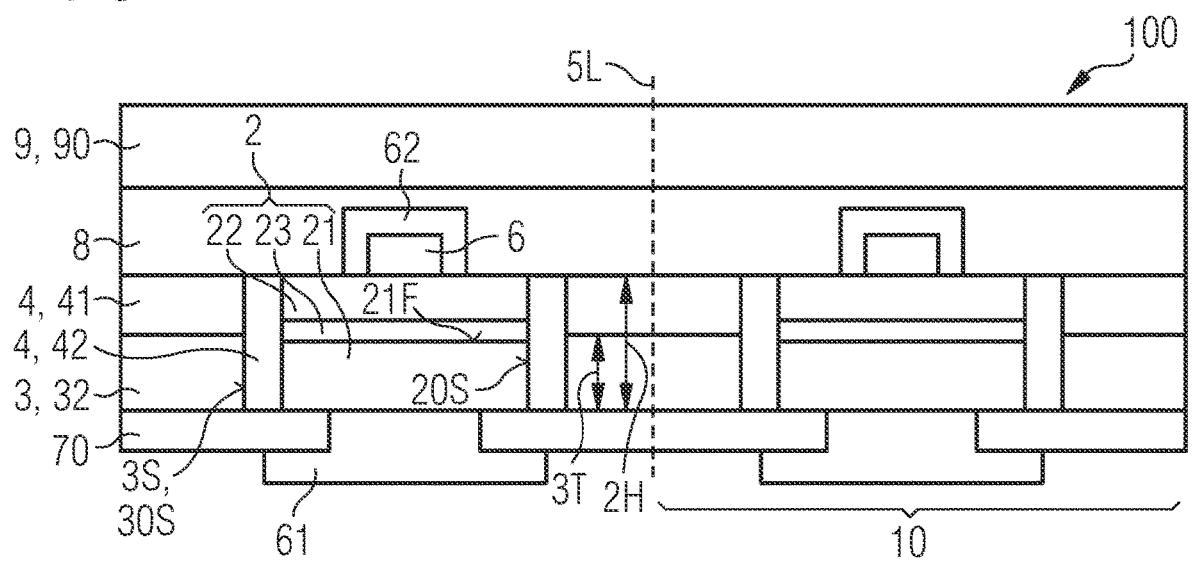

A component group 100 having a number of components 10 according to FIG. 3C is shown schematically in sectional view in FIG. 3D. Analogous to the exemplary aspect shown in FIG. 1N, the component group 100 can be singulated along the separating lines 5L into a plurality of individual components 10 or into rows and columns of components 10.

Figure 3E:
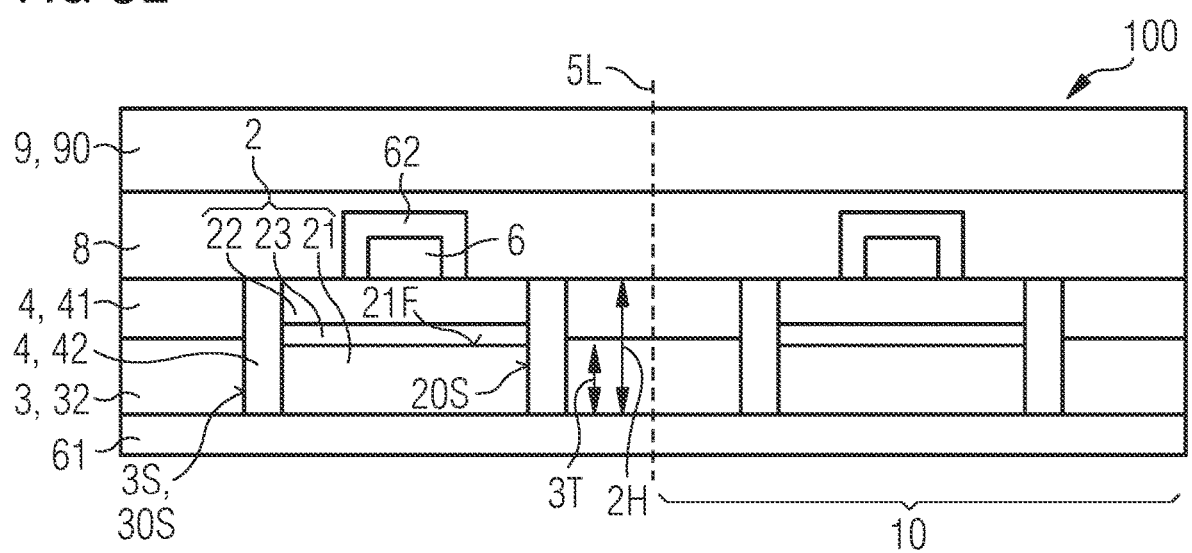

The exemplary aspect shown in FIG. 3E essentially corresponds to the exemplary aspect shown in FIG. 3D. In contrast, the component group 100 has a common first contact layer 61 instead of a plurality of structured first contact layers 61.

Figure 4A:
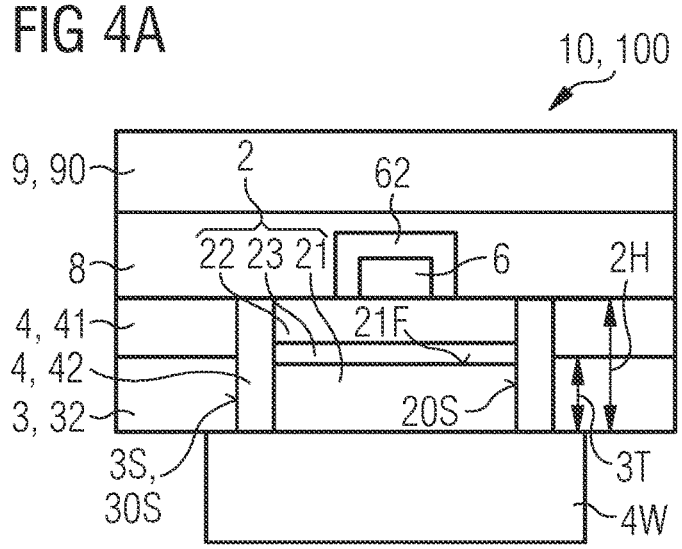
Figure 4B:
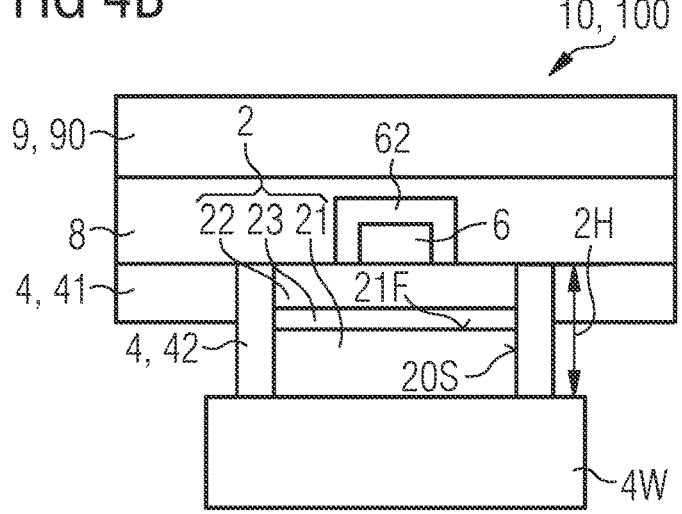

The exemplary aspect shown in FIG. 4A essentially corresponds to the exemplary aspect shown in FIG. 3B. In contrast to this, a further cover layer 4W, which is a resist layer for example, is arranged on the semiconductor body 2, wherein in top view of the carrier 9 or 90, the further cover layer 4W covers the semiconductor body 2 in particular completely. The remaining buffer layer 3, in particular the plurality of outer subregions 32 of the buffer layer 3, can be removed selectively to the material of the cover layer 4, in particular selectively to silicon dioxide dry-chemically, for example with chlorine plasma, and/or wet-chemically, in particular with H3PO4 (FIG. 4B).

A third insulating layer 7 or 73, which serves in particular as a final passivation, can be applied to the semiconductor body 2 and to the cover layer 4 after removing the further cover layer 4W. Completely analogous to the exemplary aspect shown in FIG. 3C, the third insulating layer 73 can be opened in certain areas, wherein a terminal layer and/or a first contact layer can be formed in the opening of the third insulating layer 73. In particular, the terminal layer is formed from a metal, TCO or combination of both and is located for instance within the opening of the third insulating layer 73. The first contact layer 61 covers the terminal layer in particular completely and is located on the third insulating layer 73.

Figure 4C:
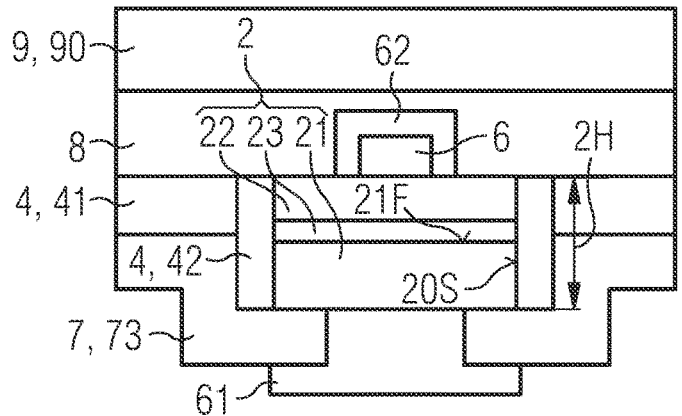

The exemplary aspect shown in FIG. 4D essentially corresponds to the exemplary aspect shown in FIG. 4C. In contrast, a reflective layer 60 or an absorbing layer 60 is arranged between the third insulating layer 73 and the cover layer 4, in particular the first partial layer 41 of the cover layer 4. The reflecting or absorbing layer 61 may be directly adjacent to the first partial layer 41, to the second partial layer 42 of the cover layer 4 and to the third insulating layer 73.

A component group 100 including a plurality of components 10 shown for instance in FIG. 4D is shown schematically in sectional view in FIG. 4E.

The exemplary aspect of a component 10 or of a component group 100 shown in FIG. 4F essentially corresponds to the exemplary aspect of a component 10 or of a component group 100 shown in FIG. 4C. In contrast to this, the buffer layer 3, in particular the outer subregion 32 of the buffer layer 3, has a structured form. In particular, the outer subregion 32 has an oblique surface 3S or 30S facing the semiconductor body 2. In particular, the buffer layer 3 is formed to be radiation-reflective. It is also possible that the obliquely formed side surface 3S or 30S is provided with a radiation-reflecting layer. In the lateral direction, the semiconductor body 2 is still completely surrounded by the second subregion 32 of the buffer layer 3. The buffer layer 3 or the outer subregion 32 of the buffer layer 3 thus serves as a lateral reflector of the component 10 or the component group 100 which deflects electromagnetic radiation R in a predetermined direction.

According to FIG. 4G, a component group 100 having a plurality of components 10 shown in FIG. 4F is schematically shown. According to FIGS. 3A to 4G, the side surfaces 20S of the grown semiconductor body 2 are not exposed at any time. The sensitive active zone 23, especially the pn-junction zone, thus remains encapsulated continuously, especially by the second partial layer 42 of the cover layer 4.

Figure 5A:
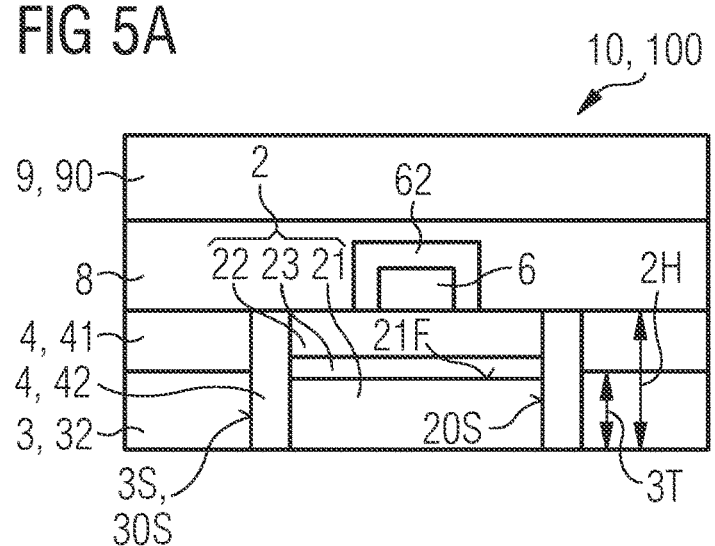

The exemplary aspect shown in FIG. 5A corresponds to the exemplary aspect shown in FIG. 3B for a component 10 or for a component group 100. The cover layer 4 and the buffer layer 3 are not removed before the semiconductor bodies 2 have been connected to the common carrier 90. As a result, the wafer composite, which is particularly formed like a wafer, can show only slight topographical differences after the regrowth of the semiconductor bodies 2, as a result of which the wafer processing is facilitated.

Figure 5B:
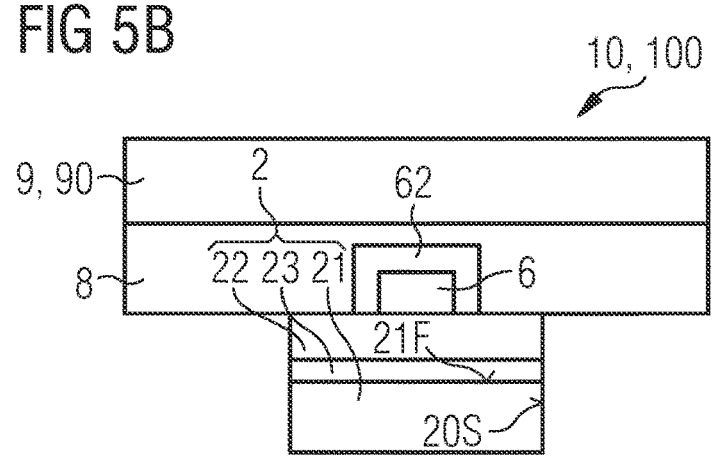

After connecting the semiconductor bodies 2 to the common carrier 90 using the connection layer 8 and after removing the growth substrate 1, the cover layer 4 and the buffer layer 3 are removed, in particular completely removed, for example by an etching method. Such a component group 100 is shown schematically in FIG. 5B, for example. After removing the buffer layer 3 and the cover layer 4 having the first partial layer 41 and the second partial layer 42, the side surfaces 20S can be reprocessed by an additional etching step, for example by a wet chemical etching step.

Figure 5C:
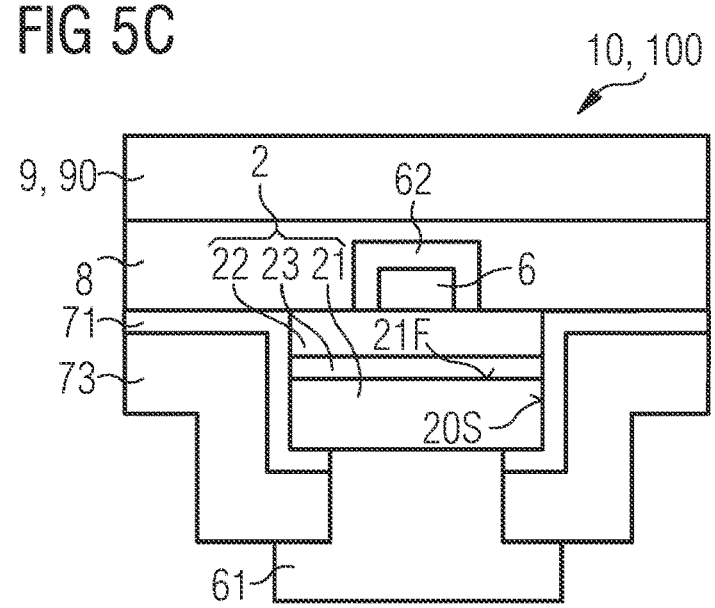

According to FIG. 5C, a first insulating layer 71 and/or a third insulating layer 73 can be applied to the semiconductor body 2 and/or to the connection layer 8 as final passivation. The first insulating layer 71 can be an ALD layer. The third insulating layer 73 can be a CVD layer. The ALD layer may be made of a material such as Al2O3, Ta2O5, AlN and similar materials. The CVD layer can be a silicon dioxide or a silicon nitride layer or a silicon oxy-nitride layer. For contacting the component 10 or the semiconductor body 2, one or a plurality of first contact layers 61 are deposited on the semiconductor body 2. The first insulating layer 71 and the third insulating layer 73 can be opened in certain areas. For example, a terminal layer is arranged in the opening of the first or third insulating layer, wherein the first contact layer 61 can completely cover the terminal layer in a plan view.

Figure 6A:
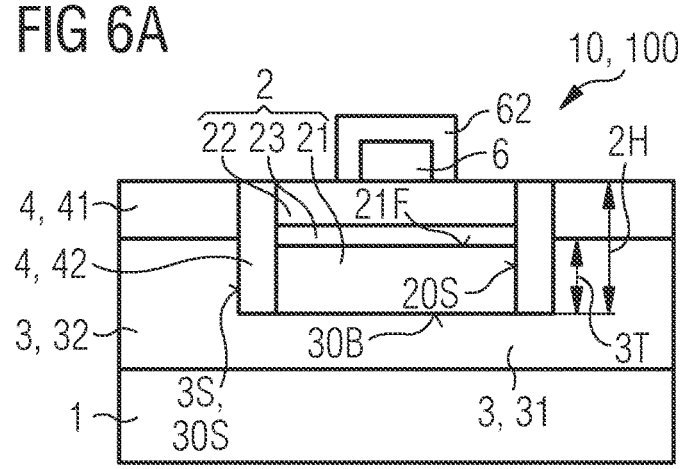
Figure 6B:
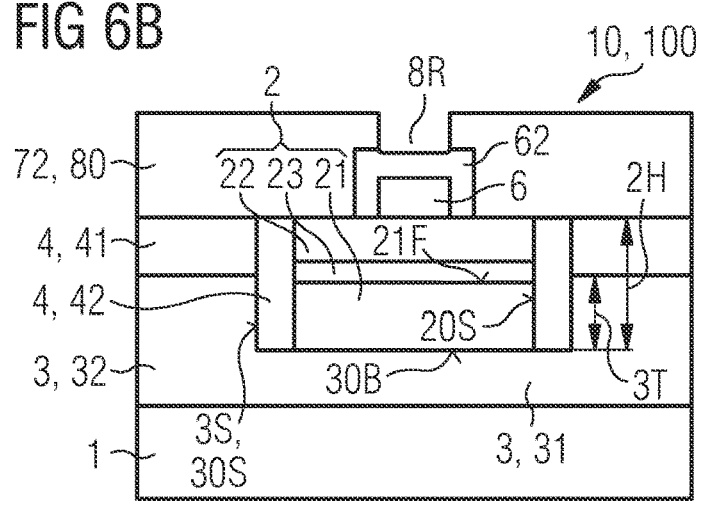

The exemplary aspect shown in FIG. 6A corresponds to the exemplary aspect shown in FIG. 3A. According to FIG. 6A, a second insulating layer 72, which serves in particular as an intermediate layer 80, is applied to the cover layer 4 and to the semiconductor bodies 2. The intermediate layer 80 has an opening 8R in the area of the second contact layer 62. The intermediate layer 80 may have a plurality of such openings 8R. In particular, the intermediate layer 80 or the second insulating layer 72 is formed from a removable, in particular dissolvable, for instance selectively etchable material. The intermediate layer 80 or the second insulating layer 72 thus serves as a removable sacrificial layer.

Figure 6C:
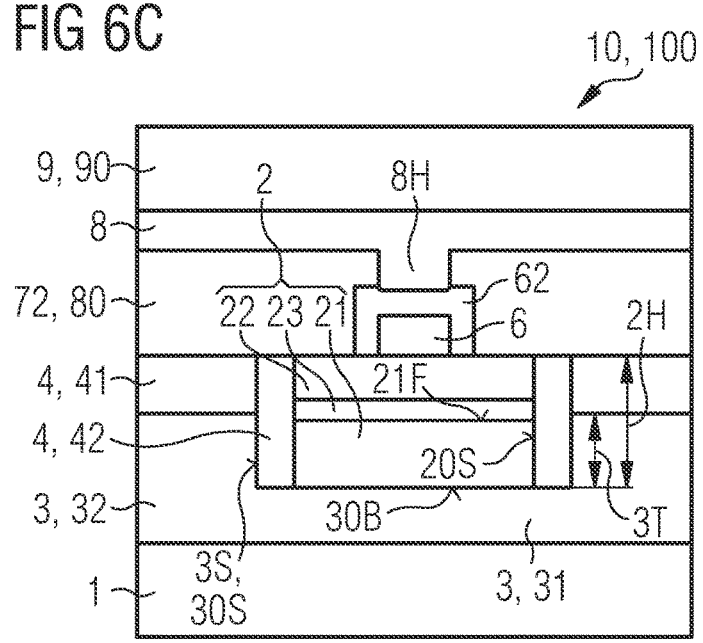

According to FIG. 6C, the semiconductor bodies 2 are mechanically connected to the common carrier 90 via the connection layer 8, wherein the connection layer 8 is located in the vertical direction between the intermediate layer 80 and the common carrier 90. Here, the connection layer 8 can completely fill the openings 8R. The connection layer 8 thus has a plurality of retaining elements 8H in the area of the opening 8R or in the areas of the openings 8R. In particular, the retaining elements 8H are formed as mechanical predetermined breaking points of the connection layer 8.

Figure 6D:
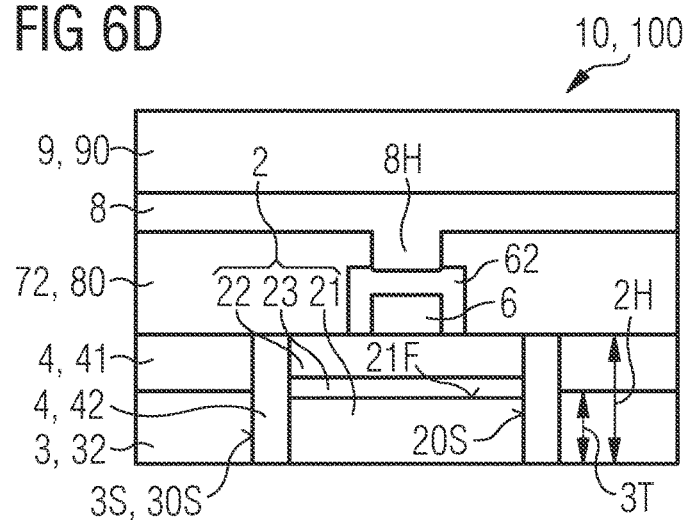
Figure 6E:
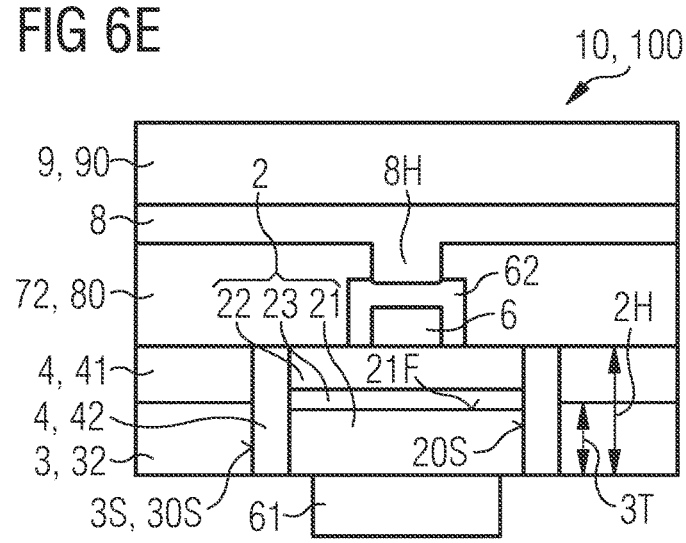

According to FIGS. 6D and 6E, the growth substrate 1 and part of the buffer layer 3 are removed, wherein one or a plurality of first contact layers 61 is/are formed subsequently.

Figure 6F:
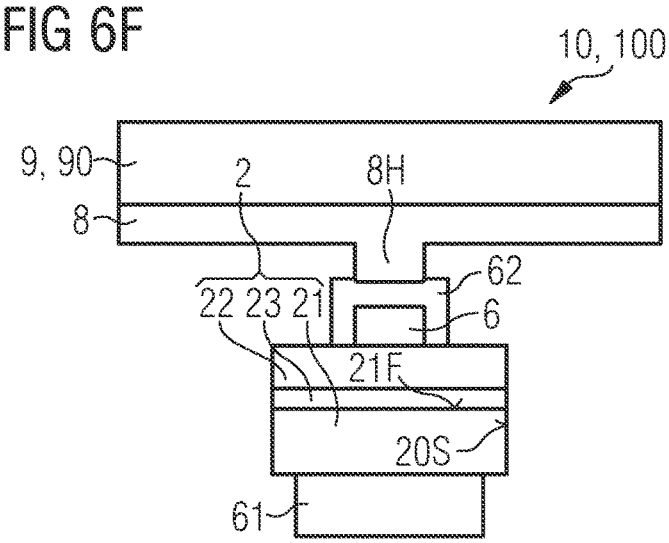

The intermediate layer 80 is removed as shown in FIG. 6F. After removing the intermediate layer 8, a semiconductor body 2 is mechanically connected to the carrier 9 or to the common carrier 90, in particular exclusively via the retaining element 8H or via the retaining elements 8H and the connection layer 8. By breaking the retaining element 8H, the semiconductor body 2 or the component 10 can be removed from the common carrier 90. For example, the component 10 is a μLED having the semiconductor body 2 with exposed side surfaces 20S.

FIG. 6F thus describes a component group 100 including of a plurality of components, each of which has a semiconductor body 2 having a first semiconductor layer 21, a second semiconductor layer 22 and an active zone 23 located therebetween. The components are attached to a common carrier 90 by a connection layer 8. The connection layer includes a plurality of retaining elements 8H which are arranged between the components 10 and the common carrier. The retaining elements 8H are formed in particular as predetermined breaking points of the connection layer and release the components under mechanical load so that the components are detachable from the common carrier and are thus transferable.

For example, the semiconductor bodies 2 have exposed side surfaces 20S. For example, at least one vertical side surface 20S or all vertical side surfaces 20S of the respective semiconductor body 2 run parallel to an m-face or to an a-face of the hexagonal wurtzite crystal structure of the semiconductor material. In particular, the semiconductor bodies 2 have exclusively side surfaces 20S which extend parallel to an m-face or to an a-face of the hexagonal wurtzite crystal structure of the semiconductor material of the semiconductor bodies 2. If the component 10 is removed from the component group 100, the component 10 includes in particular such a semiconductor body 2. The exposed side surfaces 20S can be passivated subsequently.

According to FIG. 6F, when removing the intermediate layer 80, the buffer layer 3 and the cover layer 4 are also removed. Deviating from FIG. 6F, it is conceivable that the first partial layer 41 and/or the second partial layer 42 of the cover layer 4 and/or of the buffer layer 3 will remain on the semiconductor body 2 after removing the intermediate layer 80.

Figure 7A:
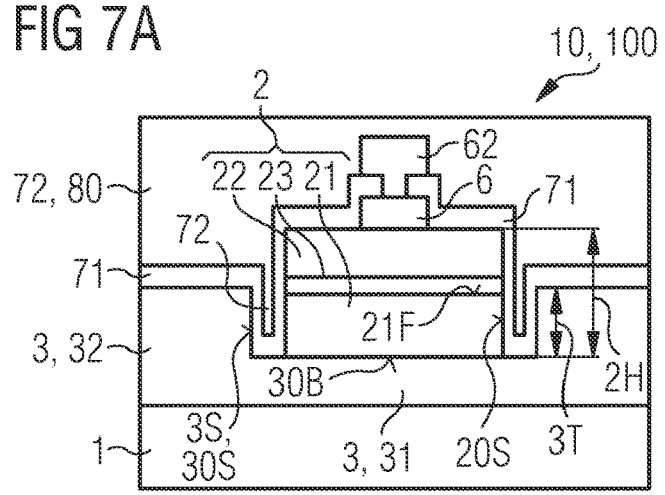
Figure 7B:
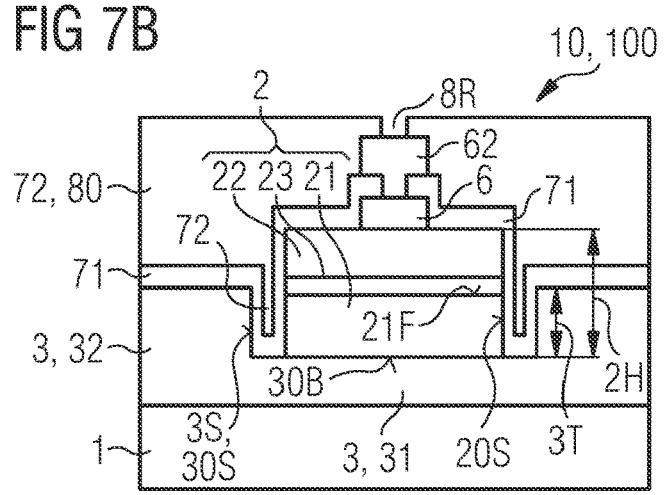
Figure 7C:
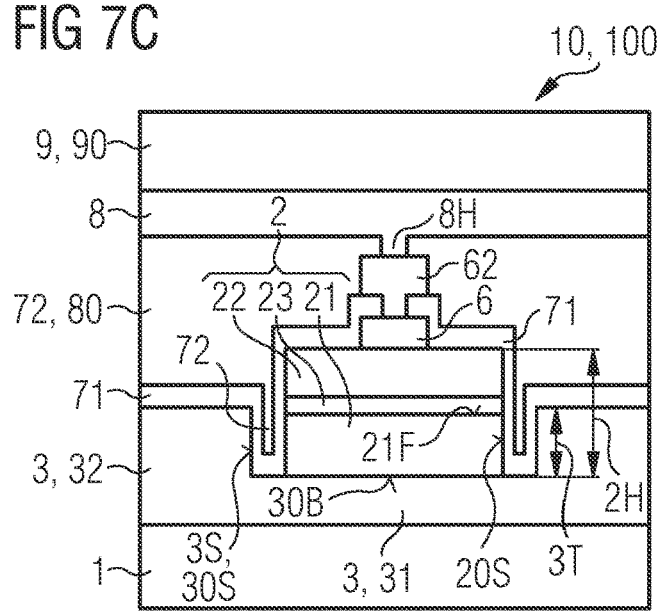
Figure 7D:
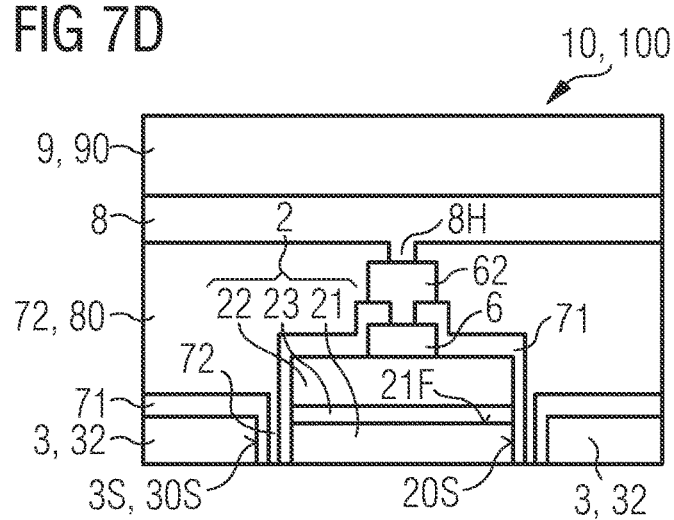
Figure 7E:
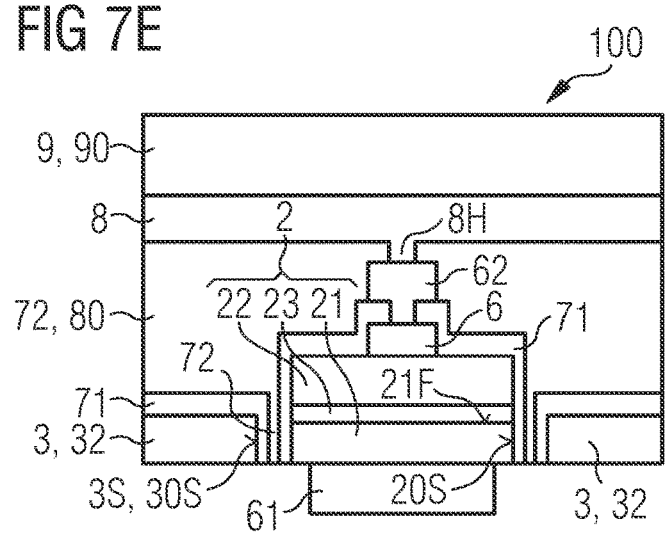
Figure 7F:
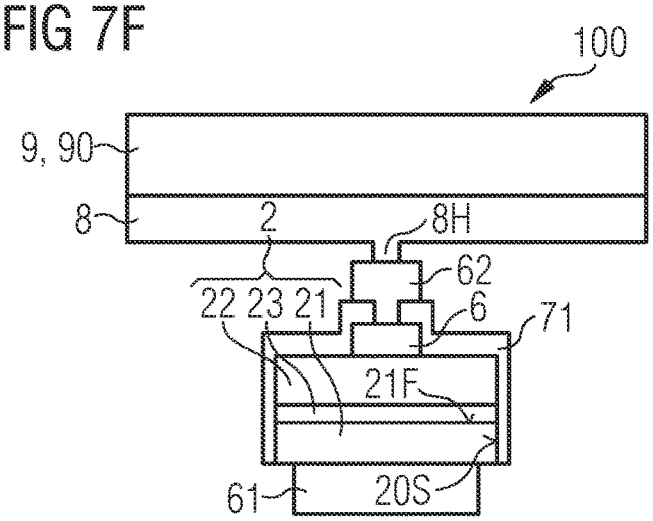

The exemplary aspect shown in FIG. 7A essentially corresponds to the exemplary aspect shown in FIG. 1J for a method step for the production of a plurality of components 10 or for the production of a component group 100. In contrast to this, the second insulating layer 72 is now formed as a dissolvable intermediate layer 80. In particular, the material of the intermediate layer 80 is selected in such a way that it can be selectively etched with respect to the material of the first insulating layer 71 and/or of the connection layer 8.

The exemplary aspects for different method steps shown in FIGS. 7B, 7C, 7D, 7E and 7F essentially correspond to the exemplary aspects for different method steps shown in FIGS. 6B, 6C, 6D, 6E and 6F for the production of the component group 100 or for the production of a plurality of components 10. In contrast, the intermediate layer 80 can be selectively removed, wherein the first insulating layer 71 remains on the associated semiconductor body 2. The first insulating layer 71 thus forms a passivation of the side surfaces 20S of the semiconductor body 2 and serves as a protective layer for the semiconductor body 2.

Figure 8A:
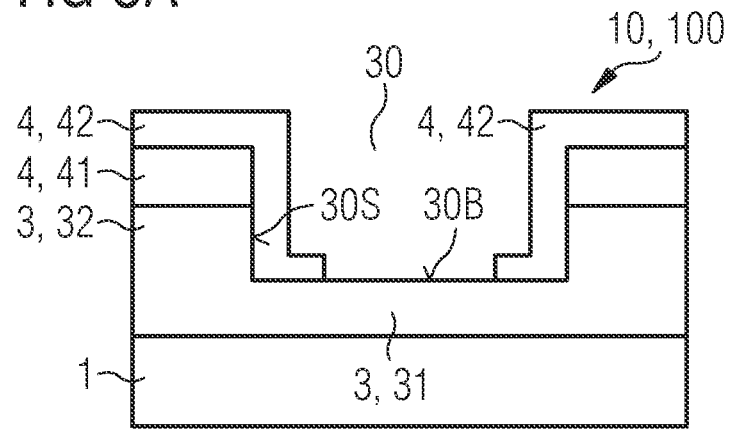
Figure 8B:
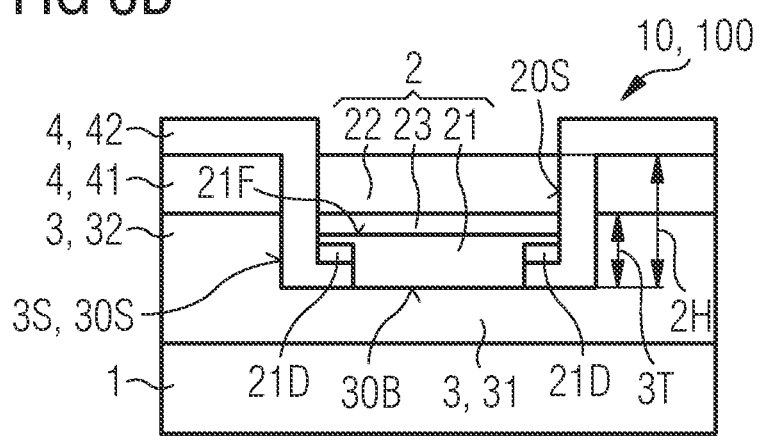

The exemplary aspect shown in FIG. 8A essentially corresponds to the exemplary aspect shown in FIG. 1E. In contrast to this, a partial area of the cover layer 4 remains on the bottom surface 30B of the opening 30, and thus forms a circumferential ring or step around the exposed bottom surface 30B. The cover layer 4, in particular the second partial layer 42, thus forms a step on the bottom surface 30B of the opening 30. The step or circumferential ring is in particular a consequence of the application of the photographic technique. However, the circumferential ring or step can have a negative effect on the crystalline quality of the regrowth of the epi-layers. The first semiconductor layer 21 may, for example, have an edge region 21D which is located directly on the step or ring of the second partial layer 42 of the cover layer 4. This edge region 21D may have a lower crystalline quality than the rest of the first semiconductor layer 21.

Figure 8C:
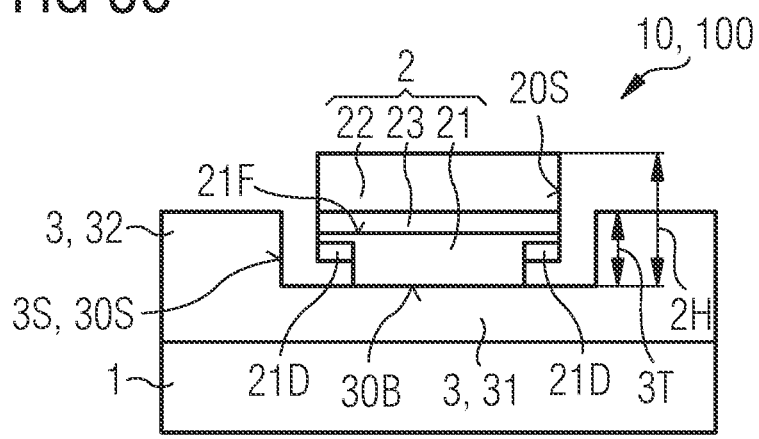

The exemplary aspect shown in FIG. 8C essentially corresponds to the exemplary aspect shown in FIG. 1H, wherein the cover layer 4 is removed. Other method steps, such as those shown in FIGS. 1I, 1J, 1K, 1L, 1M, 1N and 1O, can also be applied to the component group 100 shown in FIG. 8C.

Figure 9A:
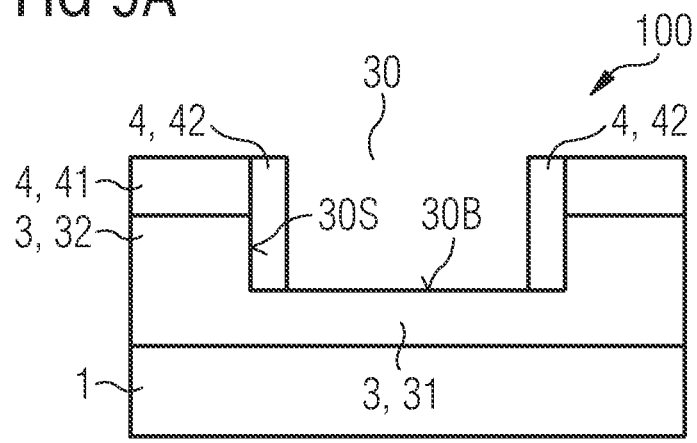

The exemplary aspect shown in FIG. 9A corresponds to the exemplary aspect shown in FIG. 1E. The second partial layer 42 of surface course 4 has vertical side surfaces. In particular, in contrast to FIG. 8A, there is no circumferential step or ring in the second partial layer 42 in FIG. 9A.

Depending on the growth conditions, the filling of the opening 30 can be done by planar or pyramidal layer growth. According to FIG. 9B, a pyramidal layer growth is performed. The first semiconductor layer 21 has the shape of a pyramid. In particular, the first semiconductor layer 21 has a surface 21F which faces away from the bottom surface 30B and is curved or angled. The active zone 23 and/or the second semiconductor layer 22 are/is grown on the angled or curved surface 21F, as a result of which the active zone 23 and the second semiconductor layer 22 follow the contour of the surface 21F.

Figure 9B:
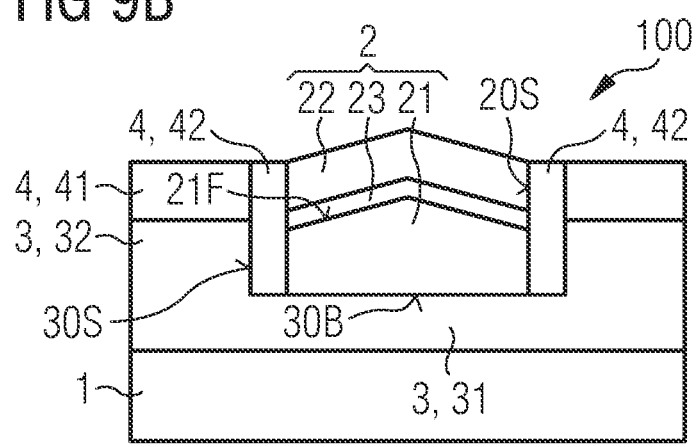
Figure 9C:
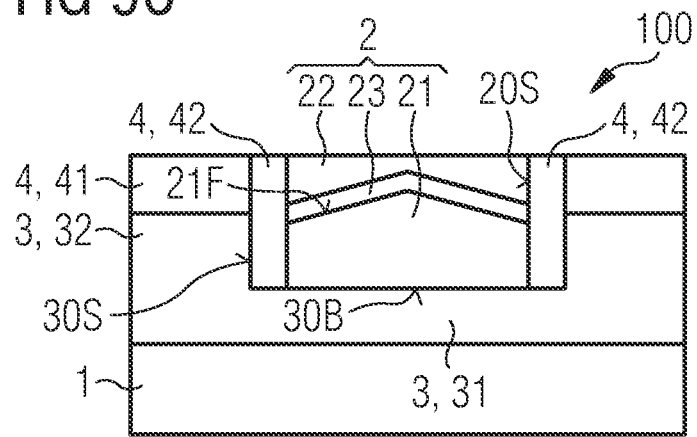

According to FIG. 9C, the second semiconductor layer 22 is planarized. The second semiconductor layer 22 thus has a surface which faces away from the bottom surface 30B and is in particular flat or planar. According to FIG. 9B, the semiconductor body 2 initially protrudes beyond the buffer layer 3 and the cover layer 4. After planarization, the semiconductor body 2 or the second semiconductor layer 22 can be flush with the cover layer 4 along the lateral directions. However, planarization can be optional.

Figure 10A:
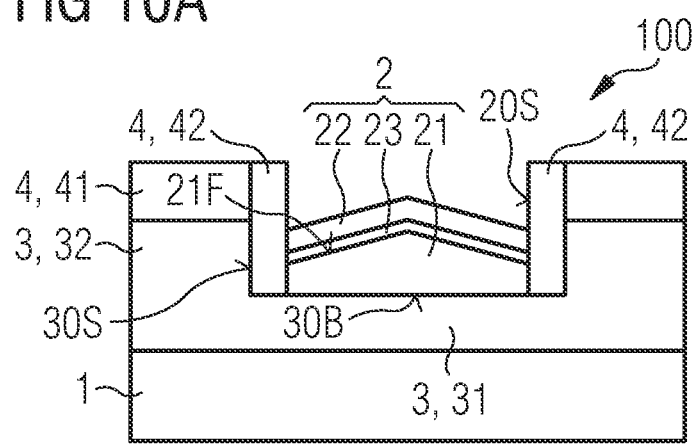
Figure 10B:
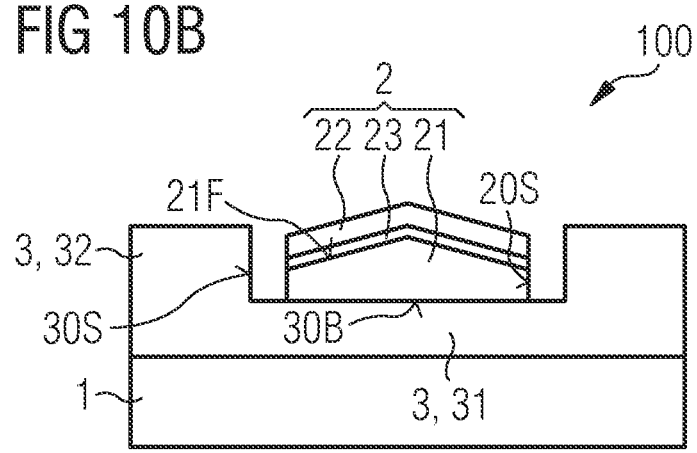

The exemplary aspects shown in FIGS. 10A and 10B essentially correspond to the exemplary aspects shown in FIGS. 9A, 9B and 9C for various method steps for the production of a component group 100 or for the production of a plurality of components 10. In contrast, the semiconductor body 2 projects along the vertical direction only over the buffer layer 3 and not over the cover layer 4. It is possible that the semiconductor body 2 does not even protrude beyond the buffer layer 3. The cover layer 4, in particular the first partial layer 41 of the cover layer 4, projects beyond the semiconductor body 2 in the vertical direction.

According to FIG. 10B, the cover layer 4 including the first partial layer 41 and the second partial layer 42 is removed, in particular completely removed. Optionally, component 10 can be planarized in the same way as shown in FIG. 9C.

The disclosure is not restricted to the exemplary aspects by the description of the disclosure made with reference to exemplary aspects. The disclosure rather includes any novel feature and any combination of features, including in particular any combination of features in the claims, even if this feature or this combination is not itself explicitly indicated in the claims or exemplary aspects.

LIST OF REFERENCE NUMERALS

100 Component group
10 Component
1 Growth substrate
2 Semiconductor body
21 First semiconductor layer
22 Second semiconductor layer
23 Active zone
2H Vertical height of the semiconductor body
20S Side surface of the semiconductor body
21D Edge region of the first semiconductor layer
21 Surface of the first semiconductor layer
3 Buffer layer
30 Opening the buffer layer
31 Subregion/inner subregion of the buffer layer
32 Subregion/outer subregion of the buffer layer
3S Side surface of the buffer layer
3T Vertical depth of the buffer layer
30B Bottom surface of the opening
30S Side surface of the opening
32H Vertical height of the outer subregion of the buffer layer
4 Cover layer
41 First partial layer of the cover layer/mask layer
42 Second partial layer of the cover layer
4W Further cover layer
5 Separating trench
5L Separating line
5Z Intermediate region
6 Mirror layer
60 Reflective layer/absorbing layer
61 Contact layer/first contact layer
62 Contact layer/second contact layer
7 Insulating layer
70 Insulating layer/final passivation
71 Insulating layer/first insulating layer
72 Insulating layer/second insulating layer 73 Insulating layer/third insulating layer
8 Connection layer
80 Intermediate layer
8R Opening of the intermediate layer
8H Retaining element
9 Barrier
90 Common carrier
R Radiation

The invention claimed is:

1. A method for producing a plurality of optoelectronic components each comprising a semiconductor body having a first semiconductor layer, a second semiconductor layer, and an active zone located therebetween, the method comprising:
    providing a growth substrate having a buffer layer arranged thereon;
    structuring the buffer layer so that it has a plurality of openings which are spaced apart from each other in lateral directions;
    forming a plurality of the semiconductor bodies in the plurality of openings, wherein in the areas of the plurality of openings, the buffer layer has subregions which are arranged in a vertical direction between the growth substrate and the plurality of semiconductor bodies; and
    detaching the growth substrate from the plurality of semiconductor bodies, wherein the buffer layer is removed at least in the subregions.

2. The method according to claim 1,
wherein the plurality of semiconductor bodies and the buffer layer are based on a same compound semiconductor material, wherein
    before providing the growth substrate having the buffer layer arranged thereon, the buffer layer is applied to the growth substrate using an epitaxy method, and
    after the structuring of the buffer layer, the plurality of semiconductor bodies are applied to the subregions of the buffer layer in the plurality of openings using a further epitaxy method.

3. The method according to claim 1,
wherein the plurality of semiconductor bodies each have a vertical height and the plurality of openings each have a vertical depth, wherein a ratio of the vertical height of one semiconductor body of the plurality of semiconductor bodies to the vertical depth of an opening of the plurality of openings corresponding to the one semiconductor body is between 0.5 and 10 inclusive.

4. The method according to claim 1,
wherein a lateral cross-section of one semiconductor body of the plurality of semiconductor bodies and a lateral cross-section of an opening of the plurality of openings corresponding to the one semiconductor body have the same geometry.

5. The method according to claim 1,
wherein the plurality of semiconductor bodies and the buffer layer are based on a semiconductor material having a hexagonal wurtzite crystal structure, wherein at least one vertical side surface or all vertical side surfaces of the semiconductor bodies and/or of the openings run parallel to an m-face or to an a-face of the hexagonal wurtzite crystal structure of the semiconductor material.

6. The method according to claim 1,
wherein in a plan view of the growth substrate, the plurality of semiconductor bodies are grown separately from one another on the buffer layer exclusively within the openings.

7. The method according to claim 1,
wherein, before the plurality of semiconductor bodies are formed, a cover layer is formed on the buffer layer in a structured manner such that
    outside the plurality of openings, the cover layer completely covers the buffer layer,
    side surfaces of the plurality of openings are formed by side surfaces of the buffer layer, wherein the side surfaces of the plurality of openings are completely covered by the cover layer, and
    the plurality of openings have bottom surfaces which are not covered or only partially covered by the cover layer at their edges,
wherein the plurality of semiconductor bodies are grown subsequently on the bottom surfaces of the plurality of openings which are not covered or exposed from the cover layer.

8. The method according to claim 1,
wherein the first semiconductor layer is formed in such a way that it has a surface which faces away from the growth substrate and is curved or angled in order to increase its overall surface area, wherein the active zone is formed on the first semiconductor layer and follows a contour of a surface of the first semiconductor layer.

9. The method according to claim 1,
wherein, before the growth substrate is detached, the plurality of semiconductor bodies are mechanically connected to a common carrier by a connection layer, wherein
    the plurality of semiconductor bodies are arranged in a vertical direction between the common carrier and the growth substrate, and
    directly after detaching the growth substrate and after removing subregions of the buffer layer, a component group comprising the plurality of optoelectronic components is formed on the common carrier.

10. The method according to claim 9,
wherein the component group is singulated along separating lines into individual components or into groups of individual components, wherein the separating lines run between the plurality of semiconductor bodies and are spaced apart from the plurality of semiconductor bodies.

11. The method according to claim 1,
wherein, before the growth substrate is detached, the plurality of semiconductor bodies are mechanically connected to a common carrier by a connection layer, wherein
    the plurality of semiconductor bodies are arranged in a vertical direction between the common carrier and the growth substrate,
    the connection layer comprises a plurality of retaining elements disposed between the plurality of optoelectronic components and the common carrier, and
    the plurality of retaining elements are formed as predetermined breaking points of the connection layer and release the plurality of optoelectronic components under mechanical load, so that the plurality of optoelectronic components are detachable from the common carrier and are therefore transferable.

12. The method according to claim 1,
wherein the buffer layer is completely removed and side surfaces of a respective semiconductor body are passivated with insulating layers.

13. A component group comprising a plurality of components, each of the plurality of components having a semiconductor body and a buffer layer, wherein:
- the semiconductor body comprises a first semiconductor layer, a second semiconductor layer, and an active zone located therebetween,
- the semiconductor body and the buffer layer are based on a same compound semiconductor material,
- the buffer layer has an opening, wherein in a plan view, the semiconductor body is arranged in the opening,
- the buffer layer laterally surrounds the semiconductor body and is electrically insulated from the semiconductor body,
- the buffer layers of the plurality of components form a common buffer layer which is continuous and has a plurality of the openings, and each of the semiconductor bodies of the plurality of components is arranged in one of the plurality of openings,
- the plurality of components are individually electrically connectable,
- the plurality of components are fixed to a common carrier by a connection layer, the connection layer comprising a plurality of retaining elements disposed between the plurality of components and the common carrier, and
- the plurality of retaining elements are formed as predetermined breaking points of the connection layer and release the plurality of components under mechanical load, so that the plurality of components are detachable from the common carrier and are therefore transferable.

14. The component group according to claim 13, wherein the semiconductor body of each of the plurality of components is grown in one of the openings and has side surfaces which are free of singulation tracks or structuring tracks.

15. The component group according to claim 13, wherein the buffer layer of each of the plurality of components has side surfaces which face the semiconductor body and are formed to be radiation-reflective.

16. The component group according to claim 13, wherein the connection layer is arranged in a vertical direction at least in regions between an intermediate layer and the common carrier, wherein after removal of the intermediate layer, the plurality of components are mechanically connected to the connection layer or to the common carrier via the plurality of retaining elements.

* * * * *